United States Patent
Lee et al.

(10) Patent No.: US 9,990,149 B2
(45) Date of Patent: Jun. 5, 2018

(54) MEMORY DEVICE FOR INTERNALLY PERFORMING READ-VERIFY OPERATION, METHOD OF OPERATING THE SAME, AND MEMORY SYSTEM INCLUDING THE SAME

(71) Applicant: SAMSUNG ELECTRONICS CO., LTD., Suwon-si, Gyeonggi-do (KR)

(72) Inventors: Taek Kyun Lee, Suwon-si (KR); Hyun Ju Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 117 days.

(21) Appl. No.: 14/997,888

(22) Filed: Jan. 18, 2016

(65) Prior Publication Data

US 2016/0231953 A1   Aug. 11, 2016

(30) Foreign Application Priority Data

Feb. 6, 2015   (KR) .................. 10-2015-0018715

(51) Int. Cl.
| | |
|---|---|
| *G06F 12/00* | (2006.01) |
| *G06F 3/06* | (2006.01) |
| *G11C 16/10* | (2006.01) |
| *G11C 16/34* | (2006.01) |

(52) U.S. Cl.
CPC .......... *G06F 3/0619* (2013.01); *G06F 3/0653* (2013.01); *G06F 3/0656* (2013.01); *G06F 3/0688* (2013.01); *G11C 16/10* (2013.01); *G11C 16/3454* (2013.01); *G11C 16/3459* (2013.01)

(58) Field of Classification Search
CPC .... G06F 3/0619; G06F 3/0653; G06F 3/0656; G06F 3/0688; G11C 16/10; G11C 16/3454; G11C 16/3459
See application file for complete search history.

(56) References Cited

U.S. PATENT DOCUMENTS

| | | | |
|---|---|---|---|
| 6,917,543 | B2 | 7/2005 | Sato |
| 7,170,782 | B2 | 1/2007 | Conley et al. |
| 7,242,611 | B2 | 7/2007 | Fujisawa et al. |
| 7,782,680 | B2 | 8/2010 | Jung et al. |
| 8,300,474 | B2 | 10/2012 | Fujita |
| 8,659,957 | B2 | 2/2014 | Sekine |
| 8,773,908 | B2 | 7/2014 | Song et al. |
| 2008/0209110 | A1* | 8/2008 | Pyeon ................. G06F 13/4247 711/103 |
| 2010/0074025 | A1* | 3/2010 | Park .................... G11C 16/3454 365/185.19 |

(Continued)

*Primary Examiner* — Charles Rones
*Assistant Examiner* — Nanci N Wong
(74) *Attorney, Agent, or Firm* — F. Chau & Associates, LLC.

(57) ABSTRACT

A method of operating a memory device includes writing initial data to non-volatile memory cells of a non-volatile memory cell array, generating a difference value based on a difference between first data related to the initial data written to the non-volatile memory cells and second data related to the initial data written to the non-volatile memory cells, comparing the difference value with a reference value, and generating and transmitting a status signal indicating that the initial data has been successfully written to a controller when the difference value is less than the reference value. The data may be randomized by the controller or the memory device.

17 Claims, 23 Drawing Sheets

(56) References Cited

U.S. PATENT DOCUMENTS

| | | | |
|---|---|---|---|
| 2011/0029718 A1* | 2/2011 | Frickey, III | G06F 12/0246 711/103 |
| 2011/0051514 A1* | 3/2011 | Han | G06F 11/1048 365/185.09 |
| 2012/0069633 A1* | 3/2012 | Katoh | G11C 13/004 365/148 |
| 2012/0233377 A1* | 9/2012 | Nomura | G06F 12/0893 711/3 |
| 2013/0141984 A1 | 6/2013 | Hirose et al. | |
| 2013/0254463 A1* | 9/2013 | Matsunaga | G06F 12/0246 711/103 |
| 2013/0308393 A1 | 11/2013 | Youn | |
| 2014/0068144 A1* | 3/2014 | Fai | G06F 12/0246 711/103 |
| 2014/0219034 A1* | 8/2014 | Gomez | G11C 16/06 365/185.22 |
| 2014/0237298 A1 | 8/2014 | Pe'er | |
| 2015/0108562 A1* | 4/2015 | Chen | H01L 27/11582 257/324 |
| 2015/0179275 A1* | 6/2015 | Patel | G11C 16/10 365/185.17 |

* cited by examiner

MEMORY DEVICE FOR INTERNALLY PERFORMING READ-VERIFY OPERATION, METHOD OF OPERATING THE SAME, AND MEMORY SYSTEM INCLUDING THE SAME

CROSS-REFERENCE TO RELATED APPLICATIONS

This application claims priority under 35 U.S.C. § 119 to Korean Patent Application No. 10-2015-0018715 filed on Feb. 6, 2015, the disclosure of which is incorporated by reference herein in its entirety.

TECHNICAL FIELD

Exemplary embodiments of the inventive concept relate to a memory device, and more particularly, to a memory device that compares two data sets to internally perform a data read-verify operation, a method of operating the same, and a memory system including the same.

DISCUSSION OF THE RELATED ART

A flash-based memory device is a non-volatile memory device which can be electrically erased and reprogrammed. Flash-based memory devices have been developed using electrically erasable programmable read-only memory (EE-PROM), and perform an erase operation on a block before writing new data to the block.

Flash-based memory devices are widely used in memory cards, universal serial bus (USB) flash drives, and solid-state drives (SSDs). In a memory system including a flash-based memory device and a memory controller, after writing critical data such as metadata to the flash-based memory device, the memory controller reads the metadata from the flash-based memory device and verifies the metadata to verify whether the metadata has been successfully written to the flash-based memory device. Such an operation is referred to as a read-verify operation or a data read-verify operation, which is performed by the memory controller.

Since verification of the metadata is performed in the memory controller, the flash-based memory device must read the metadata from a memory cell array and transmit the metadata to the memory controller. As a result, when the read-verify operation of the metadata is performed in the memory controller, the performance of the memory system including the memory controller may deteriorate.

In addition, as the performance of a host system using the memory system increases, the memory controller may skip the read-verify operation in response to a state indicating that the metadata has been written to the memory cell array. This may be done in an effort to avoid the performance deterioration caused by the read-verify operation of the metadata. In this case, when the metadata written to the memory cell array is corrupt, the memory controller is not able to detect the corruption of the metadata at the time of corruption. When the metadata is corrupt and this corruption is not detected, the memory system or a host system using the memory system may not operate normally.

SUMMARY

Exemplary embodiments of the inventive concept provide a memory device capable of increasing performance without transmitting data, the target of a read-verify operation, to a controller, which may prevent corruption of data without a loss of performance compared to a case in which the read-verify operation is skipped. Exemplary embodiments provide a memory device capable of internally verifying the read-verify target data, a method of operating the same, and a memory system including the same.

According to an exemplary embodiment of the inventive concept, a method of operating a memory device includes writing initial data to non-volatile memory cells of a non-volatile memory cell array, generating a difference value based on a difference between first data related to the initial data written to the non-volatile memory cells and second data related to the initial data written to the non-volatile memory cells, comparing the difference value with a reference value, generating a status signal indicating that the initial data has been successfully written when the difference value is less than the reference value, and transmitting the status signal to a controller.

In an exemplary embodiment, the initial data is randomized by one of the controller and the memory device.

In an exemplary embodiment, generating the difference value includes reading the initial data from the non-volatile memory cells, generating the first data and the second data based on the initial data that has been read, and calculating the difference value using the first data and the second data. The first data corresponds to a number of on-cells from among the non-volatile memory cells and the second data corresponds to a number of off-cells from among the non-volatile memory cells.

In an exemplary embodiment, writing the initial data includes writing the initial data to the non-volatile memory cells using a first buffer. The first data is obtained by copying the initial data stored in the first buffer to a second buffer, the second data is obtained by reading the initial data from the non-volatile memory cells and subsequently storing the initial data in the first buffer, and the difference value is a number of bitwise differences between values of the first data stored in the second buffer and corresponding values of the second data stored in the first buffer.

In an exemplary embodiment, writing the initial data includes writing the initial data to the non-volatile memory cells using a first buffer. The first data is obtained by storing the initial data in the first buffer, the second data is obtained by reading the initial data from the non-volatile memory cells and subsequently storing the initial data in a second buffer, and the difference value is a number of bitwise differences between values of the first data stored in the first buffer and corresponding values of the second data stored in the second buffer.

In an exemplary embodiment, writing the initial data includes writing the initial data to the non-volatile memory cells using a first buffer. The first data is obtained by copying the initial data stored in the first buffer to a second buffer, the second data is obtained by reading the initial data from the non-volatile memory cells and subsequently storing the initial data in a third buffer, and the difference value is a number of bitwise differences between values of the first data stored in the second buffer and corresponding values of the second data stored in the third buffer.

In an exemplary embodiment, writing the initial data includes writing the initial data to the non-volatile memory cells using a second buffer. The first data is obtained by copying the initial data from a first buffer to the second buffer, the second data is obtained by reading the initial data from the non-volatile memory cells and subsequently storing the initial data in a third buffer, and the difference value is a number of bitwise differences between values of the first data stored in the second buffer and corresponding values of the second data stored in the third buffer.

In an exemplary embodiment, the reference value is written to the memory device by the controller.

In an exemplary embodiment, the reference value is determined based on at least one of program/erase cycles and a read count with respect to the non-volatile memory cells.

In an exemplary embodiment, the initial data is metadata related to an operation of the memory device, and the metadata is stored in the non-volatile memory cells using single-level cell programming when each of the non-volatile memory cells is a multi-level cell storing information of at least two bits.

In an exemplary embodiment, the non-volatile memory cell array is a three-dimensional memory cell array and each of the non-volatile memory cells includes a charge trap layer.

According to an exemplary embodiment of the inventive concept, a memory device includes a non-volatile memory cell array including non-volatile memory cells. Initial data output from a controller is written to the non-volatile memory cells. The memory device further includes a difference value generation circuit configured to generate a difference value based on a difference between first data related to the initial data written to the non-volatile memory cells and second data related to the initial data written to the non-volatile memory cells, a register configured to store a reference value, and a comparator configured to compare the difference value with the reference value stored in the register and to generate a status signal indicating that the initial data has been successfully written when the difference value is less than the reference value.

In an exemplary embodiment, the difference value generation circuit includes a page buffer configured to store the initial data read from the non-volatile memory cells, an on-cell counter configured to generate the first data based on the initial data stored in the page buffer, an off-cell counter configured to generate the second data based on the initial data stored in the page buffer, and a subtractor configured to calculate the difference value using the first data and the second data. The first data corresponds to a number of on-cells from among the non-volatile memory cells and the second data corresponds to a number of off-cells from among the non-volatile memory cells.

In an exemplary embodiment, the difference value generation circuit includes a first buffer configured to store the first data related to the initial data written to the non-volatile memory cells, a second buffer configured to store the first data copied from the first buffer, and a data comparator configured to calculate a number of differences between values of the first data output from the second buffer and corresponding values of the second data output from the first buffer, and to generate the difference value. The first buffer stores the second data read from the non-volatile memory cells.

In an exemplary embodiment, the difference value generation circuit includes a first buffer configured to store the first data related to the initial data written to the non-volatile memory cells, a second buffer configured to store the second data read from the non-volatile memory cells, and a data comparator configured to calculate a number of differences between values of the first data stored in the first buffer and corresponding values of the second data stored in the second buffer, and to generate the difference value.

In an exemplary embodiment, the difference value generation circuit includes a first buffer configured to store the first data related to the initial data written to the non-volatile memory cells, a second buffer configured to store the first data copied from the first buffer, a third buffer configured to store the second data read from the non-volatile memory cells, and a data comparator configured to calculate a number of differences between values of the first data stored in the second buffer and corresponding values of the second data stored in the third buffer, and to generate the difference value.

In an exemplary embodiment, the difference value generation circuit includes a first buffer configured to receive the first data, a second buffer configured to store the first data, in which the first data is copied from the first buffer and is subsequently written to the non-volatile memory cells, a third buffer configured to store the second data read from the non-volatile memory cells, and a data comparator configured to calculate a number of differences between values of the first data stored in the second buffer and corresponding values of the second data stored in the third buffer, and to generate the difference value.

In an exemplary embodiment, the reference value is written to the register by the controller.

In an exemplary embodiment, the reference value is determined based on at least one of program/erase cycles and a read count with respect to the non-volatile memory cells.

In an exemplary embodiment, the initial data is metadata related to an operation of the memory device, and the metadata is stored in the non-volatile memory cells using single-level cell programming when each of the non-volatile memory cells is a multi-level cell storing information of at least two bits.

According to an exemplary embodiment of the inventive concept, a memory system includes a controller and a memory device connected to the controller. The memory device includes a non-volatile memory cell array including non-volatile memory cells, in which initial data output from the controller is written to the non-volatile memory cells, a difference value generation circuit configured to generate a difference value based on a difference between first data related to the initial data written to the non-volatile memory cells and second data related to the initial data written to the non-volatile memory cells, a register configured to store a reference value, and a comparator configured to compare the difference value with the reference value stored in the register and to generate a status signal indicating that the initial data has been successfully written when the difference value is less than the reference value.

In an exemplary embodiment, the difference value generation circuit includes a page buffer configured to store the initial data read from the non-volatile memory cells, an on-cell counter configured to generate the first data based on the initial data stored in the page buffer, in which the first data corresponds to a number of on-cells from among the non-volatile memory cells, an off-cell counter configured to generate the second data based on the initial data stored in the page buffer, in which the second data corresponds to a number of off-cells from among the non-volatile memory cells, and a subtractor configured to calculate the difference value using the first data and the second data.

In an exemplary embodiment, the controller includes a randomizer configured to randomize input data and to generate randomized data as the initial data.

In an exemplary embodiment, the controller determines the reference value based on at least one of program/erase cycles and a read count with respect to the non-volatile memory cells, and writes the reference value to the register.

In an exemplary embodiment, the controller transmits an indicator signal to the memory device. The indicator signal indicates that the initial data is metadata related to an operation of the memory device. Each of the non-volatile memory cells is a multi-level cell storing information of at least two bits. The memory device writes the metadata to the non-volatile memory cells using single-level cell programming.

According to an exemplary embodiment of the inventive concept, a method of operating a memory device includes writing initial data to non-volatile memory cells of a non-volatile memory cell array, generating a difference value based on a difference between first data related to the initial data written to the non-volatile memory cells and second data related to the initial data written to the non-volatile memory cells, comparing the difference value with a reference value, and generating a status signal. The status signal has a first state indicating that the initial data has been successfully written or a second state indicating that the initial data has not been successfully written. The status signal has the first state when the difference value is less than the reference value and has the second state when the difference value is greater than or equal to the reference value. The method further includes transmitting the status signal without the initial data to a controller when the status signal has the first state, and transmitting the status signal and the initial data to the controller when the status signal has the second state.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1A:
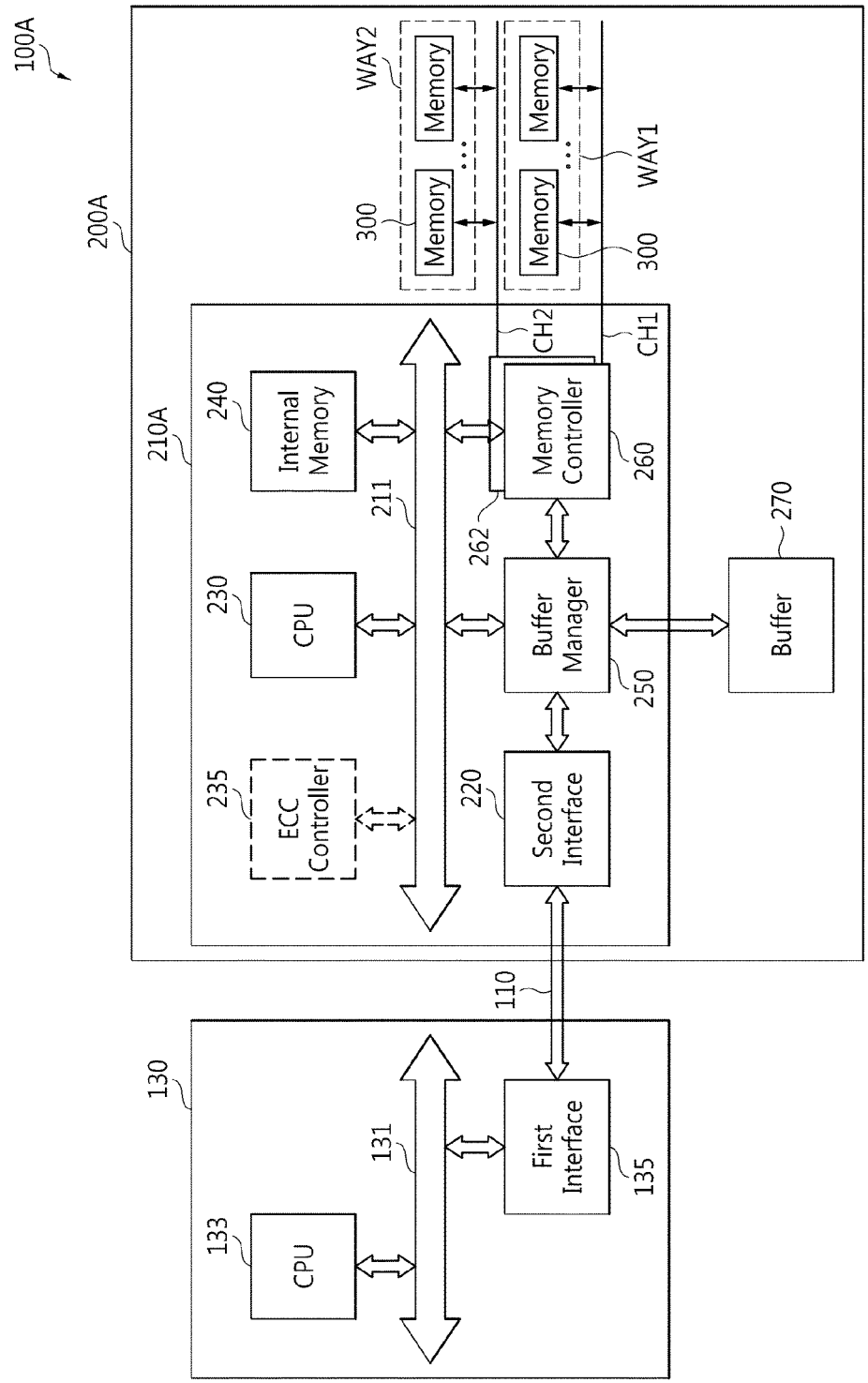
FIG. 1A is a block diagram of a data processing system according to an exemplary embodiment of the inventive concept.

Exemplary embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when an element is referred to as being "connected" or "coupled" to another element, it can be directly connected or coupled to the other element or intervening elements may be present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1A is a block diagram of a data processing system 100A according to an exemplary embodiment of the inventive concept. Referring to FIG. 1A, the data processing system 100A may include a host 130 and a data storage device 200A, which are connected with each other through an interface 110. The data processing system 100A or 100B, which will be described hereinafter, may be implemented as, for example, a server computer, a personal computer (PC), a desktop computer, a laptop computer, a workstation computer, a network-attached storage (NAS), a data center, an internet data center (IDC), or a mobile computing device. The mobile computing device may be, for example, a cellular phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of things (IoT) device, an Internet of everything (IoE) device, or an e-book. However, exemplary embodiments of the inventive concept are not limited thereto.

The interface 110 may be implemented as, for example, a serial advanced technology attachment (SATA) interface, a SATA express (SATAe) interface, a SAS (serial attached small computer system interface (SCSI)), a peripheral component interconnect express (PCIe interface), a non-volatile memory express (NVMe) interface, or an advanced host controller interface (AHCI). However, exemplary embodiments of the inventive concept are not limited thereto.

Figure 1B:
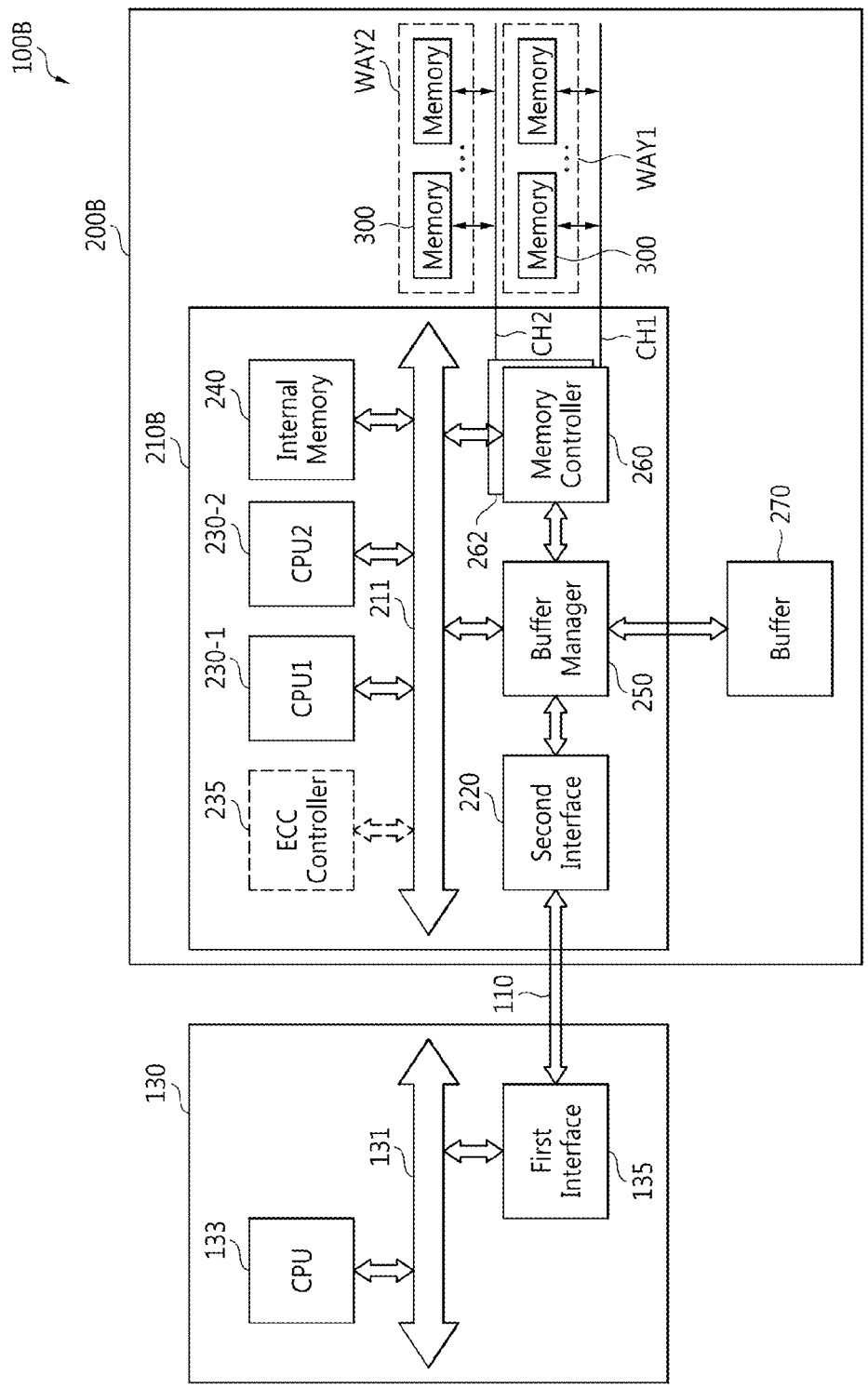
FIG. 1B is a block diagram of a data processing system according to an exemplary embodiment of the inventive concept.

The host 130 may control a data processing operation (e.g., a write or read operation) of the data storage device 200A. The host 130 may include, for example, bus architecture 131, a central processing unit (CPU) 133, and a first interface 135. Although FIGS. 1A and 1B show the host 130 as including the bus architecture 131, the CPU 133, and the first interface 135, the host 130 according to exemplary embodiments may include additional components. For example, the host 130 may also include a display controller that controls the operation of a display.

The host 130 may be implemented as, for example, an integrated circuit (IC), a motherboard, a system-on-chip (SoC), an application processor (AP), or a mobile AP. However, exemplary embodiments of the inventive concept are not limited thereto. For example, the host 130 may be any type of device that can control the operation of the data storage device 200A or 200B.

The CPU 133 may communicate a command and/or data with the first interface 135 through the bus architecture 131. The bus architecture 131 may be implemented, for example, as an advanced microcontroller bus architecture (AMBA), an advanced high-performance bus (AHB), an advanced peripheral bus (APB), an advanced extensible interface (AXI), an advanced system bus (ASB), or a combination thereof. However, exemplary embodiments of the inventive concept are not limited thereto.

The CPU 133 may generate a write request for controlling a write operation of the data storage device 200A or 200B or a read request for controlling a read operation of the data storage device 200A or 200B. The write request may include a write address and the read request may include a read address. The CPU 133 may include at least one core.

The first interface 135 may change the format of a command and/or data to be transmitted to the data storage device 200A or 200B, and may transmit the command and/or data in a changed format to the data storage device 200A or 200B through the interface 110. For example, the first interface 135 may convert the command and/or data into a format compatible with the data storage device 200A or 200B. The first interface 135 may also change the format of a response and/or data received from the data storage device 200A or 200B, and may transmit the response and/or data in a changed format to the bus architecture 131. The first interface 135 may include, for example, a transceiver that transmits and receives a command and/or data. The first interface 135 may have a structure that can support the protocol of the interface 110.

The data storage device 200A may include a controller 210A, a buffer 270, and memory devices 300. The data storage device 200A may be a memory system such as, for example, a flash-based memory device. The data storage device 200A may be implemented as, for example, a solid-state drive or solid-state disk (SSD), an embedded SSD (eSSD), a universal flash storage (UFS), a multimedia card (MMC), or an embedded MMC (eMMC). However, exemplary embodiments of the inventive concept are not limited thereto.

The data storage device 200A may be connected to or disconnected from the host 130 through the interface 110. The data storage device 200A may be, for example, a secure digital (SD) card or a universal serial bus (USB) flash drive. However, exemplary embodiments of the inventive concept are not limited thereto.

The controller 210A may control the transmission of a command (or a response) and/or data among the host 130, the buffer 270, and the memory devices 300. The controller 210A may read and execute firmware stored in at least one of the memory devices 300 to control the overall operation of the data storage device 200A. The firmware may include, for example, a host interface layer, an address translation layer (FTL), a virtual flash layer, and a flash interface layer. However, exemplary embodiments of the inventive concept are not limited thereto.

The controller 210A may be implemented as, for example, an IC or an SoC. The controller 210A may include bus architecture 211, a second interface 220, a CPU 230, an internal memory 240, a buffer manager 250, and at least one memory controller 260 and/or 262. The controller 210A may also include an error correction code or error checking and correcting (ECC) controller 235. The ECC controller 235 may check data transmitted to or received from at least one of the memory devices 300 for errors, and may correct errors according to the check result. The bus architecture 211 may be implemented as, for example, AMBA, AHB, APB, AXI, ASB, or a combination thereof. However, exemplary embodiments of the inventive concept are not limited thereto.

The second interface 220 may change the format of a signal (or data) to be transmitted to the host 130 and may transmit the signal (or data) in a changed format to the host 130 through the interface 110. For example, the second interface 220 may convert the signal (or data) into a format compatible with the host 130. The second interface 220 may also change the format of a signal (or data) received from the host 130 and may transmit the signal (or data) in a changed format to the bus architecture 211 or the buffer manager 250. However, exemplary embodiments of the inventive concept are not limited thereto. The second interface 220 may include, for example, a transceiver that transmits and receives a signal and/or data. The second interface 220 may have a structure that can support the protocol of the interface 110.

The CPU 230 may control the second interface 220, the internal memory 240, the buffer manager 250, and/or the at least one memory controller 260 and/or 262 through the bus architecture 211. The CPU 230 may also control the ECC controller 235 through the bus architecture 211. The CPU 230 may include at least one core.

FIG. 1B is a block diagram of a data processing system 100B according to an exemplary embodiment of the inventive concept. Referring to FIGS. 1A and 1B, the structure and operations of a controller 210B illustrated in FIG. 1B are substantially the same as those of the controller 210A illustrated in FIG. 1A, with the exception that the controller 210B includes two CPUs 230-1 and 230-2. Accordingly, the structure and operations of the data processing system 100B including the data storage device 200B illustrated in FIG. 1B are substantially the same as those of the data processing system 100A including the data storage device 200A illustrated in FIG. 1A. For convenience of explanation, elements and processes previously described with reference to FIG. 1A may be omitted herein.

Referring to FIG. 1B, the first CPU 230-1 may control a bilateral operation with the host 130 and the second CPU 230-2 may control a bilateral operation with the memory devices 300. The first CPU 230-1 may control the operation of the second interface 220 and the second CPU 230-2 may control the operation of the at least one memory controller 260 and/or 262. At least one of the memory controllers 260 and 262 may include at least one core that controls the operation of the memory devices 300. The bilateral operation may refer an operation of transmitting and receiving a command and/or data. For convenience of explanation, the CPU 230, the first CPU 230-1, and the second CPU 230-2 may be collectively referred to herein as the CPU 230.

Referring to FIGS. 1A and 1B, the CPU 230 may control the operation of the at least one memory controller 260 and/or 262 in response to a request (e.g., a write request or a read request) output from the host 130.

The internal memory 240 may function as an operation memory of the CPU 230. The internal memory 240 may include volatile memory and/or non-volatile memory. When the internal memory 240 is formed of non-volatile memory, the non-volatile memory may be, for example, read-only memory (ROM). However, exemplary embodiments of the inventive concept are not limited thereto. When the internal memory 240 is formed of volatile memory, the volatile memory may be, for example, static random access memory (SRAM), a buffer, buffer memory, or cache. However, exemplary embodiments of the inventive concept are not limited thereto. Alternatively, the internal memory 240 may be formed of tightly coupled memory (TCM) that can be accessed by the CPU 230. However, exemplary embodiments of the inventive concept are not limited thereto.

The buffer manager 250 may control the transmission of a command and/or data among the bus architecture 211, the second interface 220, the at least one memory controller 260 and/or 262, and the buffer 270.

The at least one memory controller 260 and/or 262 may communicate a command and/or data with at least one way WAY1 and/or WAY2 through at least one channel CH1 and/or CH2. Here, a channel (e.g., CH1 and/or CH2) may refer to an independent data path disposed between a memory device 300 (e.g., a flash memory device) and the memory controller 260 or 262. A way (e.g., WAY1 and/or WAY2) may refer to a group of memory devices 300 that share the same channel with each other. The independent data path may include a plurality of transmission lines for transmitting a command, a response, and/or data. However, exemplary embodiments of the inventive concept are not limited thereto. The data storage device 200A may increase sequential read or write performance using the multiple channels CH1 and CH2 and the multiple ways WAY1 and WAY2.

The first memory controller 260 may communicate a command and/or data with memory devices 300 included in the first way WAY1 through the first channel CH1. The second memory controller 262 may communicate a command and/or data with memory devices 300 included in the second way WAY2 through the second channel CH2.

The at least one memory controller 260 and/or 262 may transmit an indicator signal (or a command including an indicator signal), which indicates that data (e.g., initial data) to be written to a memory cell array of a memory device 300 is metadata, to the memory device 300. In response to the indicator signal, the memory device 300 may write the metadata to the memory cell array using single-level cell programming. The memory device 300 may also perform an internal read-verify operation on the metadata in response to the indicator signal. The internal read-verify operation performed on the metadata will be described in detail with reference to FIGS. 2 through 18. The term "internal read-verify operation" performed on the metadata may refer to a method of verifying whether the metadata has been successfully programmed to the memory cell array in the memory device 300 instead of the controller 210A or 210B, and more particularly, instead of the CPU 230.

In exemplary embodiments, a first direct memory access (DMA) controller may be disposed between the buffer manager 250 and the first memory controller 260, and a second DMA controller may be disposed between the buffer manager 250 and the second memory controller 262. The first DMA controller may control data transmission between the buffer manager 250 and the first memory controller 260, and the second DMA controller may control data transmission between the buffer manager 250 and the second memory controller 262.

The buffer 270 may be controlled by the buffer manager 250. The buffer 270 may be formed of, for example, dynamic random access memory (DRAM). However, exemplary embodiments of the inventive concept are not limited thereto. The buffer 270 may function as a cache. Therefore, data to be transmitted to the host 130 or data to be transmitted to the memory devices 300 may be temporarily stored in the buffer 270. Each of the memory devices 300 may include, for example, a first memory area for storing metadata and a second memory area for storing user data. The structure and operations of the memory devices 300 will be described in detail with reference to FIGS. 2, 5, 12A, 12B and 22.

The memory devices 300 may perform an internal read-verify operation on internal read-verify target data (e.g., metadata or randomized data), and may transmit only the status corresponding to the result of the internal read-verify operation to the controller 210A or 210B, instead of transmitting the internal read-verify target data itself. As a result, the performance of the data storage device 200A or 200B, and thus, the memory system including the memory devices 300, may be improved.

Figure 2:
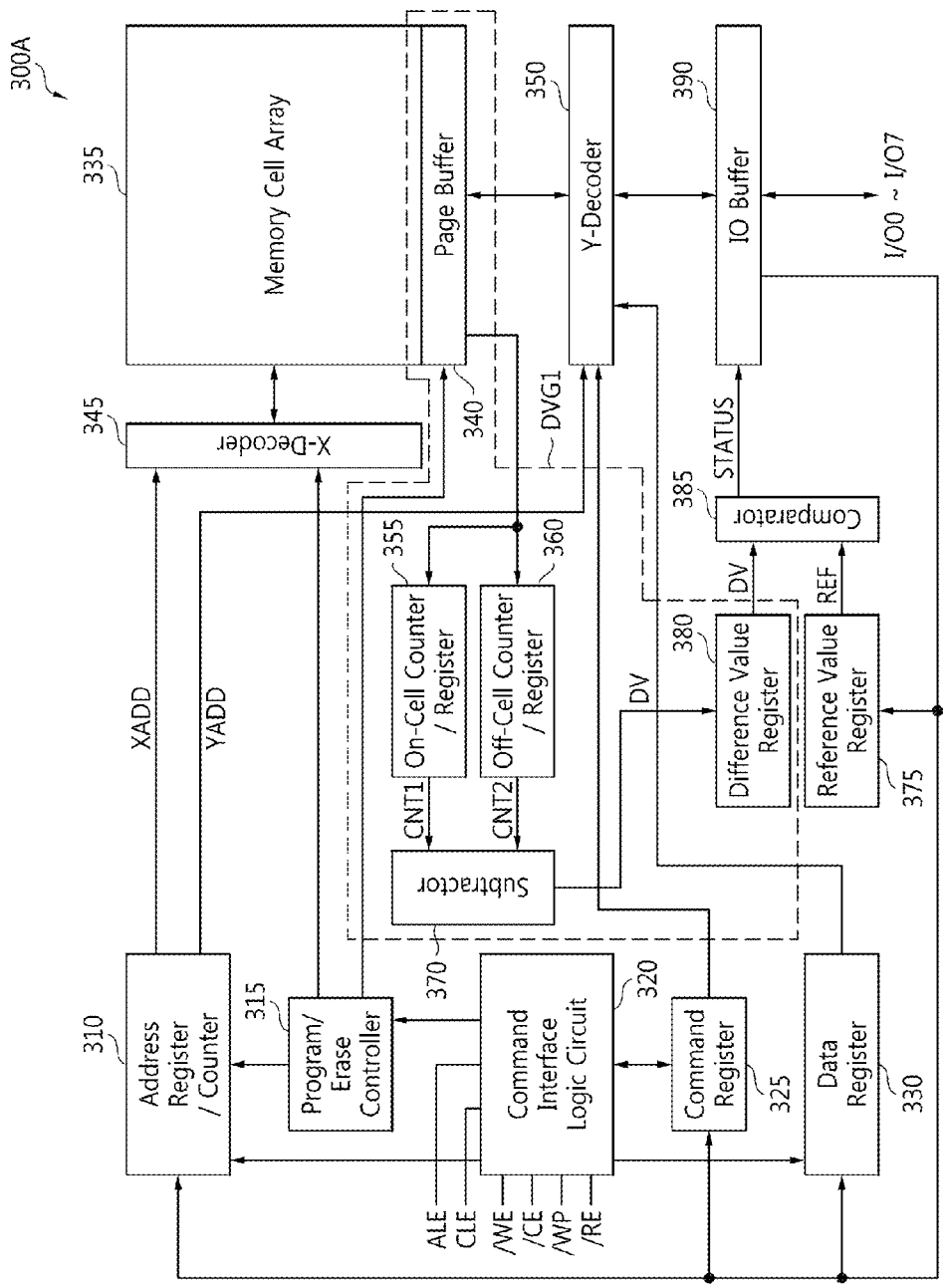
FIG. 2 is a block diagram of an example of the memory device illustrated in FIGS. 1A and 1B according to an exemplary embodiment of the inventive concept.

FIG. 2 is a block diagram of an example 300A of the memory device 300 illustrated in FIGS. 1A and 1B according to an exemplary embodiment of the inventive concept. Referring to FIGS. 1A through 2, the memory device 300A may include, for example, an address register and counter (hereinafter, referred to as an "address register/counter") 310, a program and erase controller (hereinafter, referred to as a "program/erase controller") 315, a command interface logic circuit 320, a command register 325, a data register 330, a memory cell array 335, a page buffer 340, an X-decoder (e.g., a row decoder) 345, a Y-decoder (e.g., a column decoder) 350, an on-cell counter and register (hereinafter, referred to as an "on-cell counter/register") 355, an off-cell counter and register (hereinafter, referred to as an "off-cell counter/register") 360, an operation circuit (e.g., a subtractor) 370, a reference value register 375, a difference value register 380, a comparator (e.g., a comparison circuit) 385, an input/output (I/O) buffer 390, and I/O pads I/O0 through I/O7.

The address register/counter 310 may store and/or count addresses received from the I/O buffer 390 in response to first control signals output from the program/erase controller 315 and first operation control signals output from the command interface logic circuit 320. The address register/counter 310 may further transmit row addresses XADD generated according to the result of storing and/or counting the addresses to the X-decoder 345, and may transmit column addresses YADD generated according to the result of storing and/or counting the addresses to the Y-decoder 350.

The program/erase controller 315 may generate the first control signals for controlling the operation of the address register/counter 310, second control signals for controlling the operation of the X-decoder 345, and third control signals for controlling the operation of the page buffer 340 in response to the second operation control signals output from the command interface logic circuit 320. The program/erase controller 315 may generate the first control signals, the second control signals, and the third control signals, which are related to a program operation or an erase operation. The control signals may include voltages necessary for the program operation or the erase operation.

The command interface logic circuit 320 may generate first operation control signals for controlling the operation of the address register/counter 310, second operation control signals for controlling the operation of the program/erase controller 315, third operation control signals for controlling the operation of the command register 325, and fourth operation control signals for controlling the operation of the data register 330 in response to control signals ALE, CLE, /WE, /CE, /WP, and /RE. Herein, ALE refers to an address latch enable signal, CLE refers to a command latch enable signal, /WE refers to a write enable signal, /CE refers to a chip enable signal, /WP refers to a write protect signal, /RE refers to a read enable signal, and "/" indicates that the signal is "low active".

The command register 325 may receive and store a command output from the I/O buffer 390 in response to the third operation control signals output from the command interface logic circuit 320. The command stored in the command register 325 may be provided for the Y-decoder 350 in response to the third operation control signals.

The data register 330 may receive and store data output from the I/O buffer 390 in response to the fourth operation control signals output from the command interface logic circuit 320. The data stored in the data register 330 may be provided for the Y-decoder 350 in response to the fourth operation control signals. The data register 330 may randomize the data output from the I/O buffer 390 to generate randomized data.

The memory cell array 335 may include a plurality of blocks. Each of the blocks may include a plurality of pages. Each of the pages may include a data region and a spare region. The minimum unit of an erase operation is a block, and the minimum unit of a program operation or a read operation is a page.

The memory cell array 335 may include a plurality of non-volatile memory cells (e.g., flash memory cells) arranged in two dimensions or three dimensions. Some of the flash memory cells may form a block or a page. Each of the flash memory cells may be a NAND-type or a NOR-type. The flash memory cells may be implemented as three-dimensional vertical NAND-type flash memory cells.

The memory cell array 335 may include a three-dimensional memory cell array. The three-dimensional memory cell array may be monolithically formed within at least one physical level of an array of memory cells having an active region placed on or above a silicon substrate, and may include a circuit related to the operation of the memory cells. The circuit may be formed within or on the substrate. The term "monolithic" means that a layer at one level of the array is directly deposited on a layer at an underlying level of the array.

The three-dimensional memory cell array may include a vertically oriented NAND string in which at least one memory cell is positioned on another memory cell. The at least one memory cell may include a charge trap layer. Each of the flash memory cells may be a single-level cell (SLC) which stores information of one bit, or a multi-level cell (MLC) which stores information of at least two bits.

Metadata related to the operations of the memory device 300A may be stored in a plurality of MLCs included in the memory cell array 335 using SLC programming. That is, 1-bit information may be stored in each MLC.

The page buffer 340 may write data to non-volatile memory cells selected by the X-decoder 345 and the Y-decoder 350 from among the plurality of non-volatile memory cells included in the memory cell array 335, or may read data from the selected non-volatile memory cells in response to the third control signals output from the program/erase controller 315. The page buffer 340 may include latches or registers which store values of data. Herein, the data to be written to the non-volatile memory cells may be referred to as initial data.

The page buffer 340 may function as a register and/or a sense amplifier. For example, the page buffer 340 may latch data (e.g., randomized data) output from the data register 330, and may write the latched data to selected non-volatile memory cells in a program operation. The page buffer 340 may sense and amplify data programmed to selected non-volatile memory cells, latch the amplified data, and transmit the latched data to the I/O buffer 390 through the Y-decoder 350 in a read operation.

The Y-decoder 350 may function as a data transmission path between the page buffer 340 and the I/O buffer 390. The Y-decoder 350 may also be referred to as a Y-gating circuit.

Figure 3:
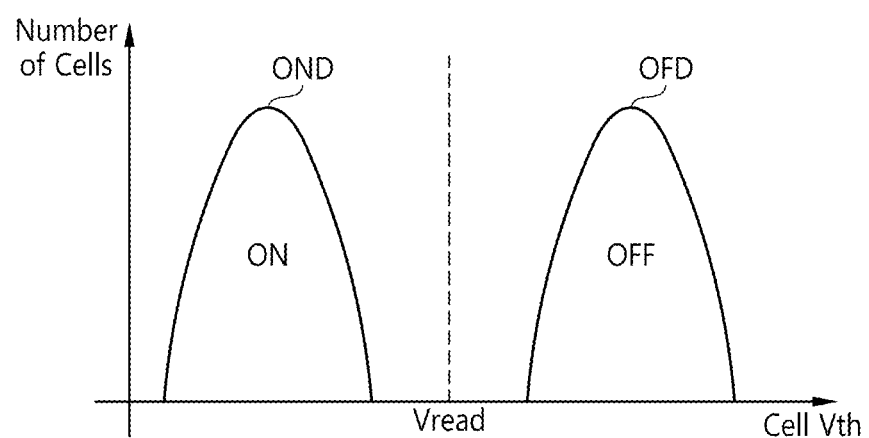
FIG. 3 is a diagram showing the threshold voltage distributions of on-cells and off-cells in the memory cell array illustrated in FIG. 2 according to an exemplary embodiment of the inventive concept.
Figure 4:
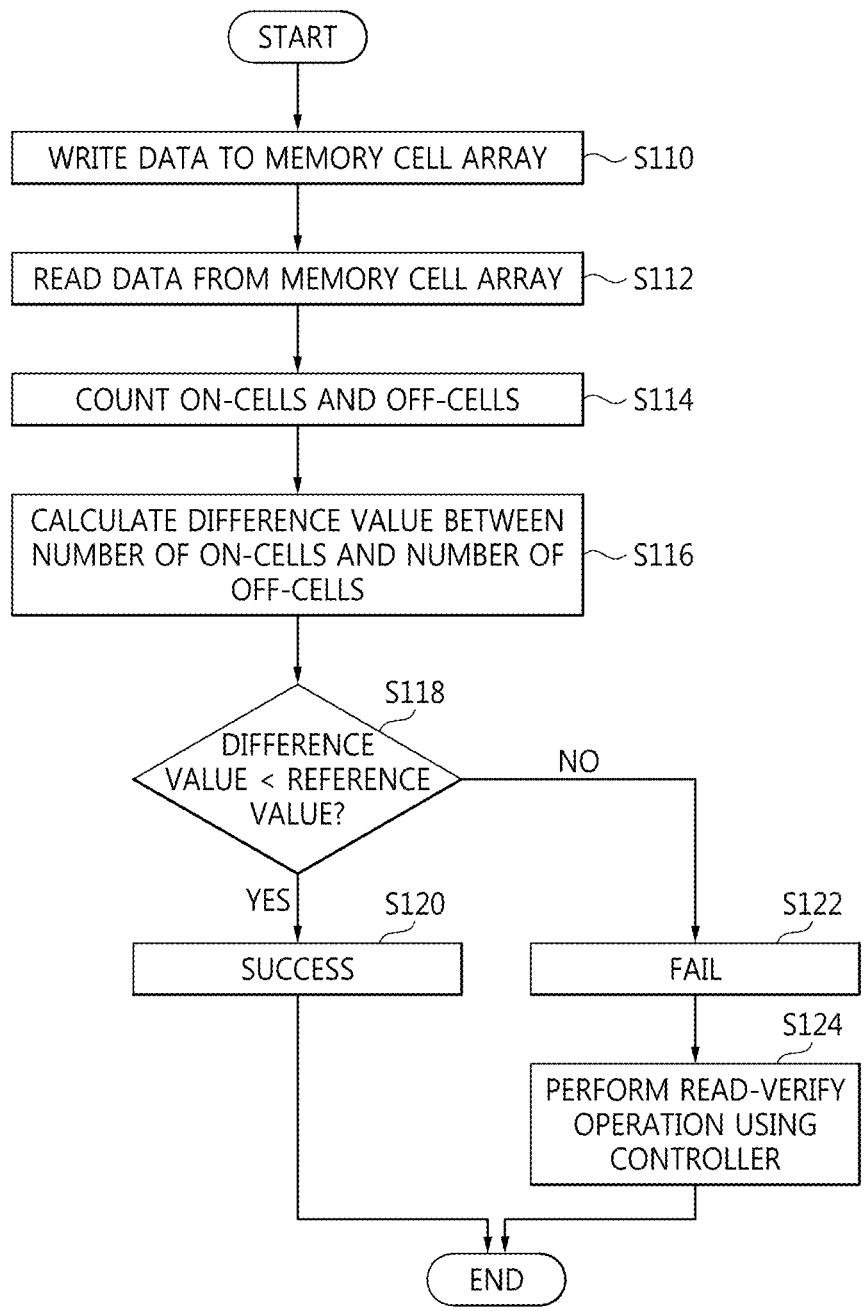
FIG. 4 is a flowchart of the operation of the memory device illustrated in FIG. 2 according to an exemplary embodiment of the inventive concept.

FIG. 3 is a diagram showing the threshold voltage distributions of on-cells and off-cells in the memory cell array 335 illustrated in FIG. 2 according to an exemplary embodiment of the inventive concept. FIG. 4 is a flowchart of the operation of the memory device 300A illustrated in FIG. 2 according to an exemplary embodiment of the inventive concept. Referring to FIGS. 1A through 4, the page buffer 340 may write data output from the memory controller 260 or 262 to non-volatile memory cells selected by the X-decoder 345 and the Y-decoder 350 from among the plurality of non-volatile memory cells in the memory cell array 335 in operation S110. The data may be, for example, metadata or randomized data. However, the data is not limited thereto. The memory controller 260 or 262 or the memory device 300A may generate the randomized data.

As shown in FIG. 3, when it is assumed that data having the data value "1" included in data (e.g., randomized data) written to selected non-volatile memory cells is stochastically about the same as data having the data value "0" included in the data (e.g., the randomized data), the number of on-cells ON storing the data having the data value "1" from among the selected non-volatile memory cells may be stochastically about the same as the number of off-cells OFF storing the data having the data value "0" from among the selected non-volatile memory cells. In FIG. 3, "OND" denotes a threshold voltage distribution of the on-cells ON, "OFD" denotes a threshold voltage distribution of the off-cells OFF, and "Vread" denotes a read voltage used to distinguish the on-cells ON from the off-cells OFF. The read voltage Vread may be a voltage for an internal read-verify operation. However, exemplary embodiments of the inventive concept are not limited thereto.

To perform an internal read-verify operation in the memory device 300A, the page buffer 340 may read data from the selected non-volatile memory cells in operation S112. During the internal read-verify operation, the on-cell counter/register 355 may count the on-cells ON among the selected non-volatile memory cells based on the data (e.g., metadata or randomized metadata) read from the selected non-volatile memory cells, may generate and latch a first count value CNT1 corresponding to the count result, and may transmit the first count value CNT1 that has been latched to the operation circuit 370 in operation S114. Here, the first count value CNT1 may be first data related to the data that has been written to the selected non-volatile memory cells.

During the internal read-verify operation, at a time that is simultaneous/in parallel with the operation of the on-cell counter/register 355, the off-cell counter/register 360 may count the off-cells OFF among the selected non-volatile memory cells based on the data (e.g., metadata or randomized metadata) read from the selected non-volatile memory cells, may generate and latch a second count value CNT2 corresponding to the count result, and may transmit the second count value CNT2 that has been latched to the operation circuit 370 in operation S114. The second count value CNT2 may be second data related to the data that has been written to the selected non-volatile memory cells. The counters 355 and 360 may perform a count operation in response to a clock signal. A total number of non-volatile memory cells to which the data (e.g., metadata or randomized metadata) has been written may be the same as the sum of the first count value CNT1 and the second count value CNT2.

The operation circuit 370, which may be implemented as a subtractor, may calculate a difference between the first count value CNT1 corresponding to the first data and the second count value CNT2 corresponding to the second data, and may transmit a difference value DV to the difference value register 380 in operation S116. The difference value DV may be, for example, an absolute value. However, the difference value DV is not limited thereto.

The reference value register 375 may receive and store a reference value from the I/O buffer 390. The difference value register 380 may receive and store the difference value DV. The reference value may be written/set in the reference value register 375 according to the control of the controller 210A or 210B. Each of the registers 375 and 380 may be, for example, a special function register (SFR). However, the registers 375 and 380 are not limited thereto.

The controller 210A or 210B may determine the reference value based on at least one of program/erase (P/E) cycles and a read count with respect to the selected non-volatile memory cells, and may write/set the reference value in the reference value register 375. Alternatively, the P/E cycles and/or the read count may be managed by the command interface logic circuit 320 and may be written/set in the reference value register 375 as the reference value by the command interface logic circuit 320. As another alternative, the reference value may be stored in the memory cell array 335 and then written/set in the reference value register 375.

The comparator 385 may receive a reference value REF from the reference value register 375 and the difference value DV from the difference value register 380, and may compare the values REF and DV with each other in operation S118. When it is determined that the difference value DV is less than the reference value REF in operation S118 (e.g., in response to determining that the difference value DV is less than the reference value REF), the comparator 385 may generate the status signal STATUS having a first state indicating that the data (e.g., metadata or randomized metadata) has been successfully written to the selected non-volatile memory cells, and may transmit the status signal STATUS to the I/O buffer 390 in operation S120.

The I/O buffer 390 may transmit the status signal STATUS having the first state to the controller 210A or 210B through at least one of the I/O pads I/O0 through I/O7. Accordingly, the controller 210A or 210B may recognize that the data (e.g., metadata or randomized metadata) has been successfully written to the selected non-volatile memory cells based on the status signal STATUS having the first state.

When it is determined that the difference value DV is equal to or greater than the reference value REF in operation S118 (e.g., in response to determining that the difference value DV is equal to or greater than the reference value REF), the comparator 385 may generate the status signal STATUS having a second state indicating that the data (e.g., metadata or randomized metadata) has not been successfully programmed to the selected non-volatile memory cells, and may transmit the status signal STATUS to the I/O buffer 390 in operation S122.

The I/O buffer 390 may transmit the status signal STATUS having the second state to the controller 210A or 210B through at least one of the I/O pads I/O0 through I/O7. Accordingly, the controller 210A or 210B may recognize that the data (e.g., metadata or randomized metadata) has not been successfully written to the selected non-volatile memory cells based on the status signal STATUS having the second state.

The memory device 300A may read the data from the selected non-volatile memory cells in the memory cell array 335 and transmit the data that has been read to the controller 210A or 210B according to the control of the controller 210A or 210B, and the controller 210A or 210B may perform a read-verify operation on the data received from the memory device 300A in operation S124.

A difference value generation circuit DVG1 illustrated in FIG. 2 may generate the difference value DV based on first data (e.g., the first count value CNT1) related to data written to non-volatile memory cells and second data (e.g., the second count value CNT2) related to the data written to the non-volatile memory cells. The difference value generation circuit DVG1 may include the page buffer 340, the on-cell counter/register 355, the off-cell counter/register 360, the operation circuit 370, and the difference value register 380.

Figures 5A, 5B:
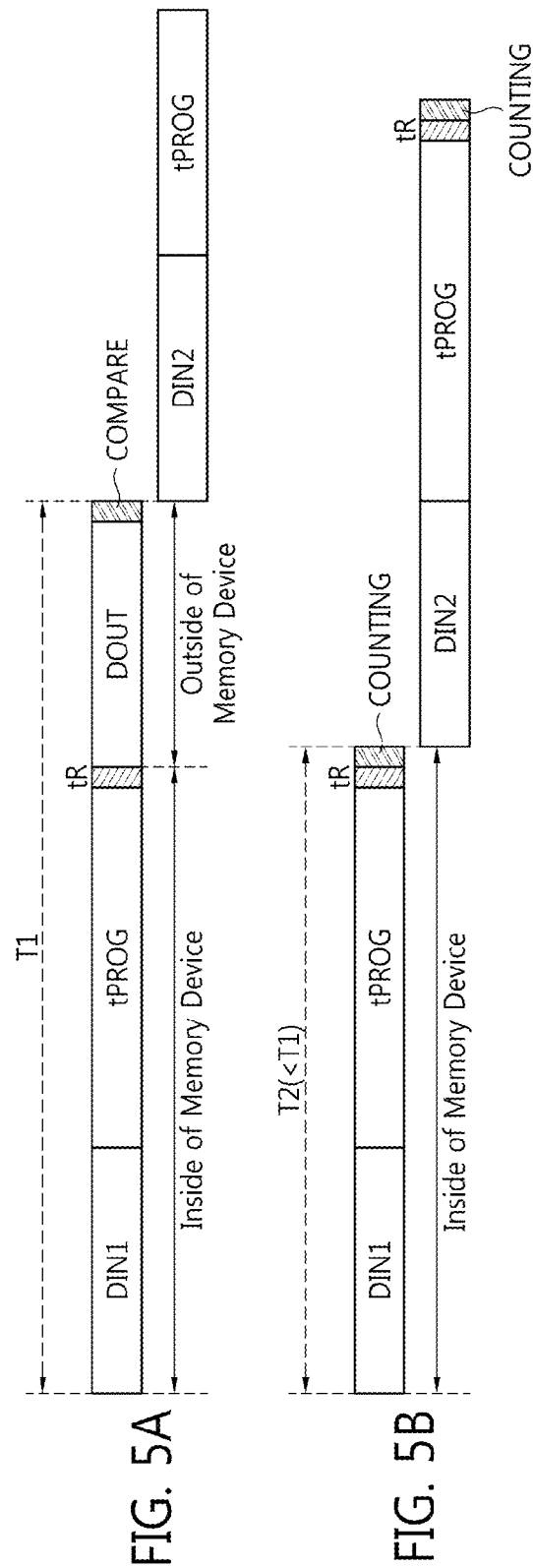
FIG. 5A is a timing chart showing a comparative example of a read-verify operation.
FIG. 5B is a timing chart showing an internal read-verify operation performed in the memory device illustrated in FIG. 2 according to an exemplary embodiment of the inventive concept.

FIGS. 5A and 5B are timing charts respectively showing a comparative example of a read-verify operation and an internal read-verify operation performed in the memory device 300A illustrated in FIG. 2 according to an exemplary embodiment of the inventive concept. Referring to FIGS. 5A and 5B, DIN1 denotes the time taken to load first data to a page buffer, DIN2 denotes the time taken to load second data to the page buffer, tPROG denotes the time taken to write the first data or the second data to non-volatile memory cells, tR denotes the time taken to read the data from the non-volatile memory cells, DOUT denotes the time taken to transmit the first or second data that has been read to a controller through I/O pads, COMPARE denotes the time taken for the controller to perform a read-verify operation, and COUNTING denotes the time taken to generate the first count value CNT1 and the second count value CNT2 according to exemplary embodiments of the inventive concept. DIN1 may refer to PDATA or PDATA1, and DIN2 may refer PDATA2.

In the comparative example of a read-verify operation illustrated in FIG. 5A, a memory device transmits data (e.g., target data of a read-verify operation, also referred to herein as "read-verify target data") to a controller, and the controller performs the read-verify operation on the data. According to exemplary embodiments of the inventive concept, as illustrated in FIG. 5B, the memory device 300A itself performs an internal read-verify operation on the read-verify target data. Accordingly, unless the status signal STATUS having the second state is generated, the memory device 300A does not transmit the read-verify target data to the controller 210A or 210B. Therefore, the data storage device 200A or 200B does not require the time DOUT. As a result, the performance of the data storage device 200A or 200B may be improved according to exemplary embodiments of the inventive concept.

According to exemplary embodiments, when the status signal STATUS has the first state, only the status signal STATUS is sent to the controller 210A or 210B. That is, when the status signal STATUS has the first state, the status signal STATUS is sent to the controller 210A or 210B without the read-verify target data (e.g., initial data). When the status signal STATUS has the second state, the status signal STATUS and the read-verify target data (e.g., initial data) are both sent to the controller 210A or 210B.

As described above, according to exemplary embodiments of the inventive concept, a memory device (e.g., the memory device 300A described with reference to FIGS. 2 through 5B) does not require the time DOUT shown in FIG. 5A to function. As a result, the time T2 taken to perform an internal read-verify operation according to exemplary embodiments of the inventive concept may be significantly shorter than the time T1 taken to perform the read-verify operation in a comparative example.

Figure 6:
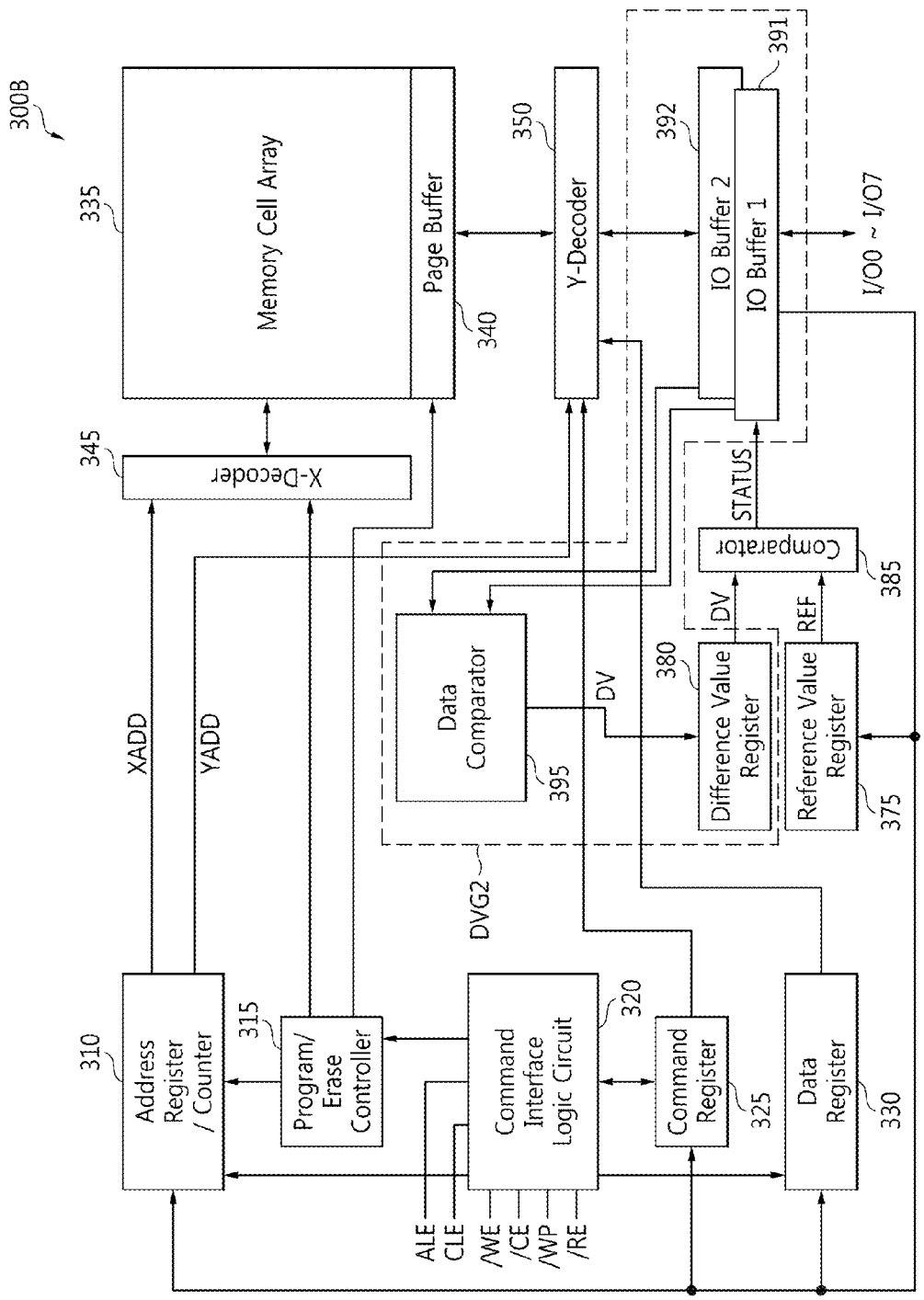
FIG. 6 is a block diagram of an example of the memory device illustrated in FIGS. 1A and 1B according to an exemplary embodiment of the inventive concept.

FIG. 6 is a block diagram of an example 300B of the memory device 300 illustrated in FIGS. 1A and 1B according to an exemplary embodiment of the inventive concept. Referring to FIG. 6, the memory device 300B may include, for example, the address register/counter 310, the program/erase controller 315, the command interface logic circuit 320, the command register 325, the data register 330, the memory cell array 335, the page buffer 340, the X-decoder 345, the Y-decoder 350, the reference value register 375, the difference value register 380, the comparator 385, two I/O buffers 391 and 392, a data comparator 395, and the I/O pads I/O0 through I/O7. For convenience of explanation, a further description of elements and processes previously described may be omitted herein.

Figure 7:
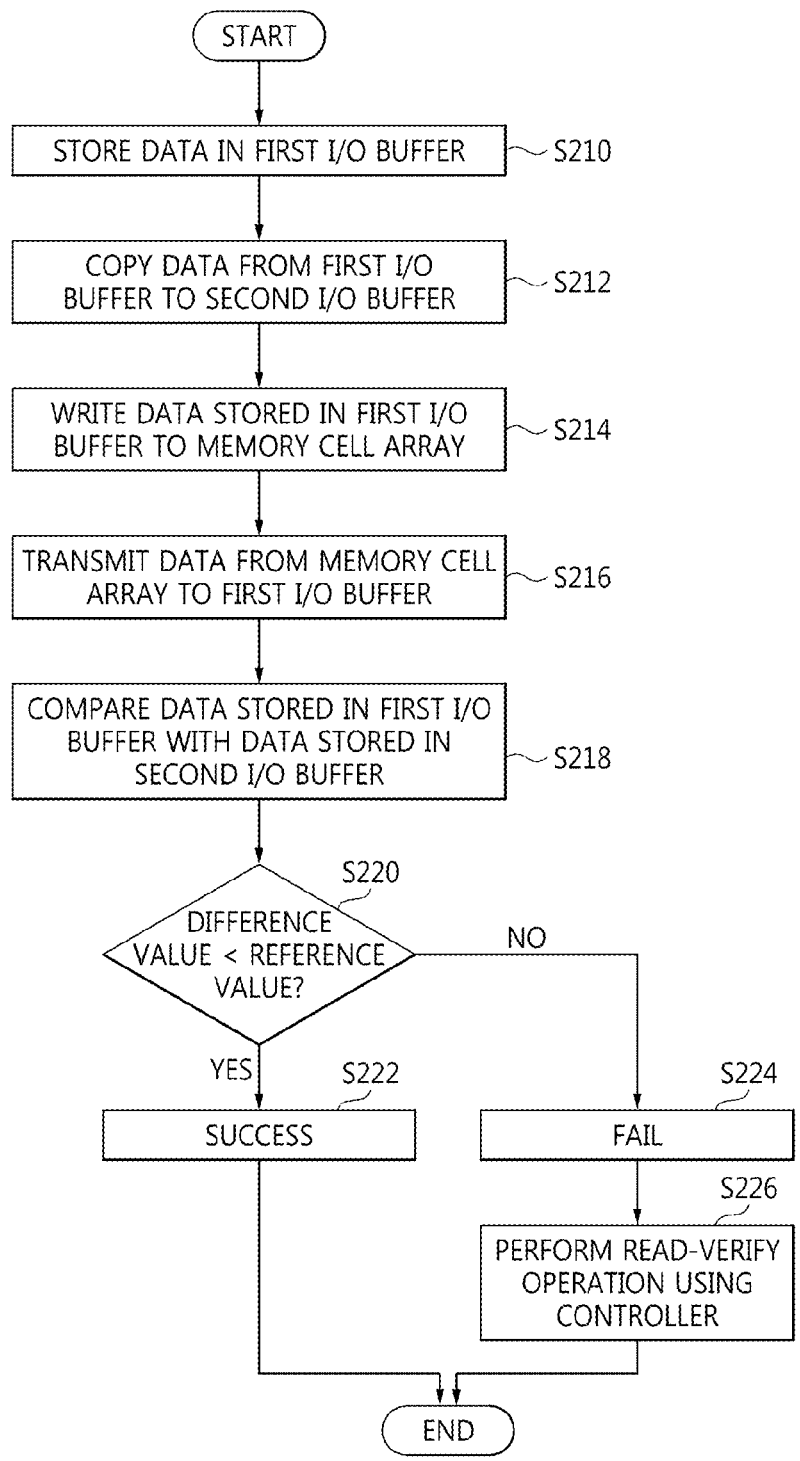
FIG. 7 is a flowchart of the operation of the memory device illustrated in FIG. 6 according to an exemplary embodiment of the inventive concept.
Figure 8:
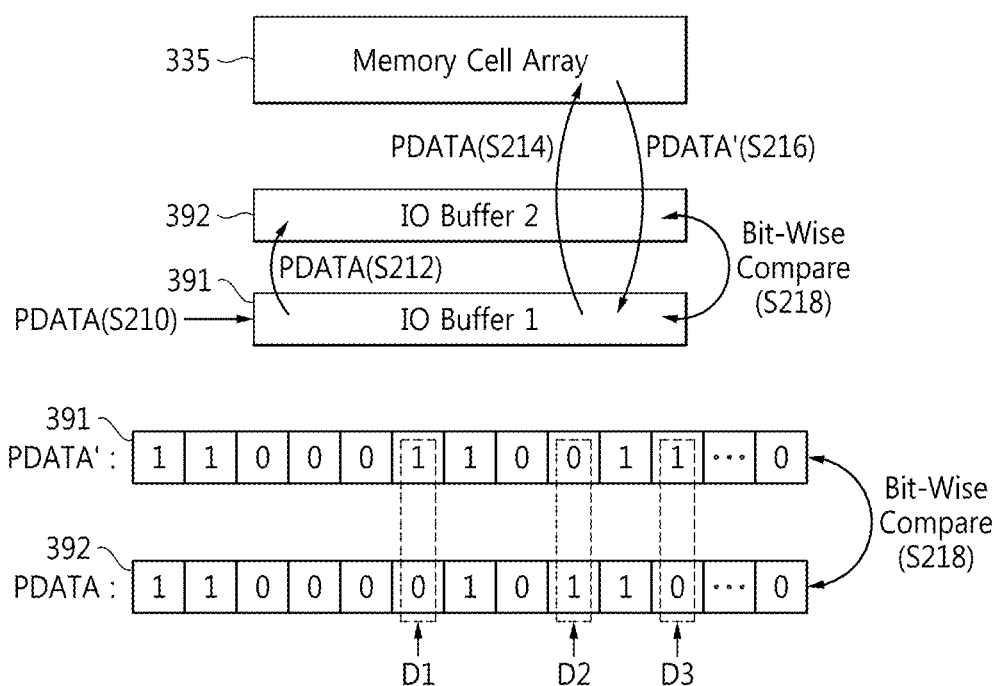
FIG. 8 is a conceptual diagram illustrating the operation of the memory device illustrated in FIG. 6 according to an exemplary embodiment of the inventive concept.
Figure 9:
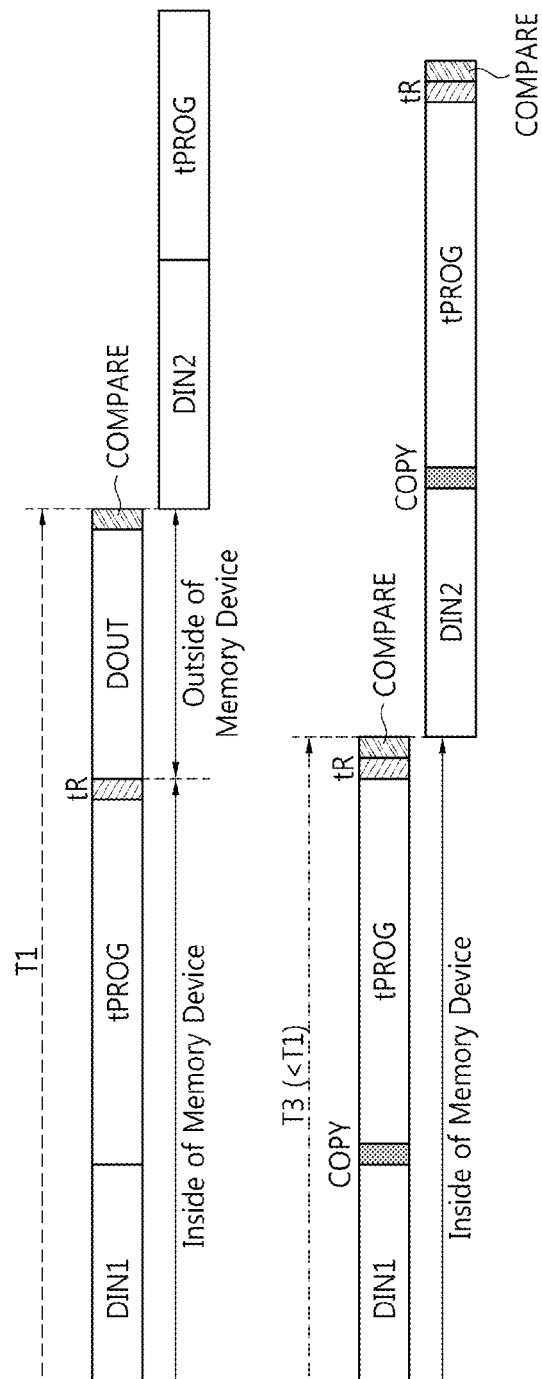
FIG. 9A is a timing chart showing a comparative example of a read-verify operation.
FIG. 9B is a timing chart showing an internal read-verify operation performed in the memory device illustrated in FIG. 6 according to an exemplary embodiment of the inventive concept.

FIG. 7 is a flowchart of the operation of the memory device 300B illustrated in FIG. 6 according to an exemplary embodiment of the inventive concept. FIG. 8 is a conceptual diagram illustrating the operation of the memory device 300B illustrated in FIG. 6 according to an exemplary embodiment of the inventive concept. FIGS. 9A and 9B are timing charts respectively showing a read-verify operation according to a comparative example and an internal read-verify operation performed in the memory device 300B illustrated in FIG. 6 according to an exemplary embodiment of the inventive concept. The operation of the memory device 300B comparing first data with second data using two I/O buffers 391 and 392 will be described with reference to FIGS. 1A and 1B and FIGS. 6 through 9B.

Data PDATA, which is output from the controller 210A or 210B and will be written to the memory cell array 335, may be stored in the first I/O buffer 391 in operation S210. The data PDATA is internal read-verify target data.

The data PDATA stored in the first I/O buffer 391 may be copied to the second I/O buffer 392 in operation S212. The data PDATA copied to the second I/O buffer 392 may be the first data. According to exemplary embodiments, the data PDATA stored in the first I/O buffer 391 is the same as the data PDATA copied to the second I/O buffer 392.

The page buffer 340 illustrated in FIG. 6 may write the data PDATA output from the first I/O buffer 391 to the memory cell array 335 in operation S214. The data PDATA may be transmitted to the page buffer 340 through the Y-decoder 350.

For the internal read-verify operation, the page buffer 340 may read data PDATA' from the memory cell array 335, and may transmit the data PDATA' that has been read to the first I/O buffer 391 through the Y-decoder 350 in operation S216. Accordingly, the data PDATA' that has been read may be stored in the first I/O buffer 391.

The data PDATA' that has been read from the memory cell array 335 may be related to the data PDATA that has been written to the memory cell array 335. For example, the data PDATA may be changed during a write operation or a read operation, and the changed data is the data PDATA' that has been read.

The data comparator 395 may receive the data PDATA (e.g., the first data from the second I/O buffer 392) and the data PDATA' (e.g. the second data from the first I/O buffer 391), may perform a bitwise comparison on the first data and the second data, and may transmit the difference value DV corresponding to the number of bitwise differences to the difference value register 380 in operation S218. As shown in FIG. 8, it is determined that three values D1, D2, and D3 are different between the first data PDATA and the second data PDATA' as a result of the bitwise comparison.

The comparator 385 may receive the reference value REF from the reference value register 375 and the difference value DV from the difference value register 380, and may compare the values REF and DV with each other in operation S220. When it is determined that the difference value DV is less than the reference value REF in operation S220 (e.g., in response to determining that the difference value DV is less than the reference value REF), the comparator 385 may generate the status signal STATUS having a first state indicating that the data PDATA (e.g., metadata or randomized metadata) has been successfully written to the memory cell array 335, and may transmit the status signal STATUS to the first I/O buffer 391 in operation S222.

The first I/O buffer 391 may transmit the status signal STATUS having the first state to the controller 210A or 210B through at least one of the I/O pads I/O0 through I/O7. Accordingly, the controller 210A or 210B may recognize that the data PDATA (e.g., metadata or randomized metadata) has been successfully written to the memory cell array 335 based on the status signal STATUS having the first state.

When it is determined that the difference value DV is equal to or greater than the reference value REF in operation S220 (e.g., in response to determining that the difference value DV is equal to or greater than the reference value REF), the comparator 385 may generate the status signal STATUS having a second state indicating that the data PDATA (e.g., metadata or randomized metadata) has not been successfully written to the memory cell array 335, and may transmit the status signal STATUS to the first I/O buffer 391 in operation S224.

The first I/O buffer 391 may transmit the status signal STATUS having the second state to the controller 210A or 210B through at least one of the I/O pads I/O0 through I/O7. Accordingly, the controller 210A or 210B may recognize that the data PDATA (e.g., metadata or randomized metadata) has not been successfully written to the memory cell array 335 based on the status signal STATUS having the second state.

The memory device 300B may read data from selected non-volatile memory cells in the memory cell array 335 and transmit the data that has been read to the controller 210A or 210B according to the control of the controller 210A or 210B, and the controller 210A or 210B may perform a read-verify operation on the data received from the memory device 300B in operation S226. The read-verify operation may be directly performed by the CPU 230. At this time, the CPU 230 may perform data comparison and management.

A difference value generation circuit DVG2 illustrated in FIG. 6 may generate the difference value DV based on the first data (e.g., the data PDATA stored in the second I/O buffer 392) related to the data PDATA written to the memory cell array 335, and the second data (e.g., the data PDATA' transmitted from the memory cell array 335 to the first I/O buffer 391) related to the data PDATA written to the memory cell array 335. The difference value generation circuit DVG2 may include the difference value register 380, the first I/O buffer 391, the second I/O buffer 392, and the data comparator 395.

FIG. 9A shows a timing chart illustrating a comparative example of a read-verify operation performed by a controller, and FIG. 9B shows a timing chart illustrating an internal read-verify operation performed in the memory device 300B illustrated in FIG. 6 according to an exemplary embodiment of the inventive concept. Referring to FIGS. 9A and 9B, DIN1 denotes the time taken to load first data to a page buffer, DIN2 denotes the time taken to load second data to the page buffer, tPROG denotes the time taken to write the first data or the second data to non-volatile memory cells, tR denotes the time taken to read the data from the non-volatile memory cells, and DOUT denotes the time taken to transmit the first or second data that has been read to a controller through I/O pads. Further, COMPARE in FIG. 9A denotes the time taken for the controller according to the comparative example to perform a read-verify operation, COMPARE in FIG. 9B denotes the time taken for the memory device 300B illustrated in FIG. 6 to perform an internal read-verify operation according to an exemplary embodiment of the inventive concept, and COPY denotes the time taken to copy data from one I/O buffer to another I/O buffer in exemplary embodiments of the inventive concept.

In the read-verify operation according to the comparative example illustrated in FIG. 9A, a memory device transmits read-verify target data to the controller and the controller performs the read-verify operation on the data. According to the exemplary embodiment of the inventive concept illustrated in FIG. 9B, the memory device 300B itself performs an internal read-verify operation on the read-verify target data. As a result, unless the status signal STATUS having the second state is generated, the memory device 300B does not transmit the read-verify target data to the controller 210A or 210B. Therefore, the data storage device 200A or 200B does not require the time DOUT to function. As a result, according to exemplary embodiments of the inventive concept, the performance of a data storage device (e.g., the data storage device 200A or 200B) may be improved.

Since the data storage device 200A or 200B does not require the time DOUT to function, the time T3 taken to perform an internal read-verify operation according to exemplary embodiments of the inventive concept may be significantly shorter than the time T1 taken to perform the read-verify operation in a comparative example.

Figure 10:
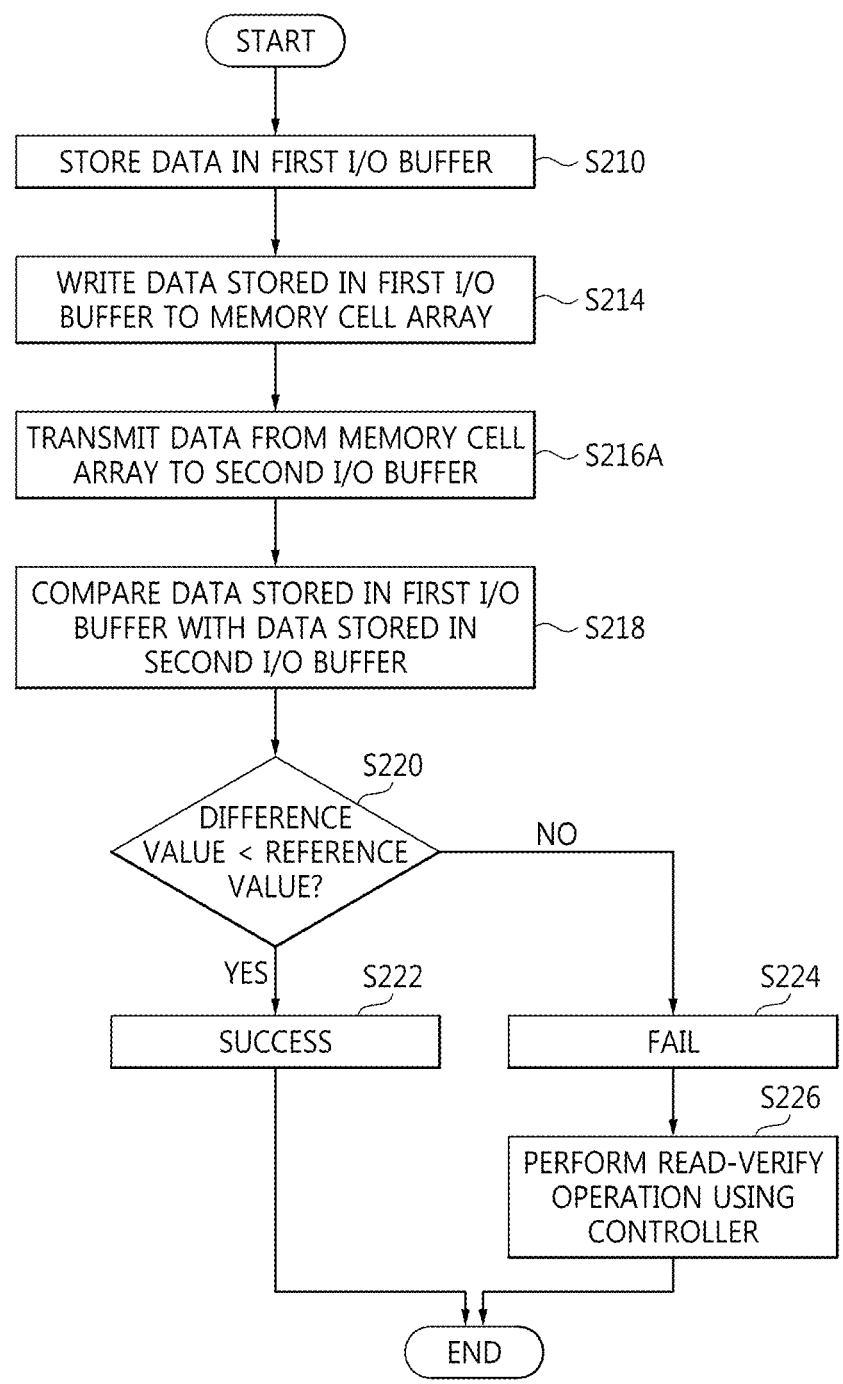
FIG. 10 is a flowchart of the operation of the memory device illustrated in FIG. 6 according to an exemplary embodiment of the inventive concept.
Figure 11:
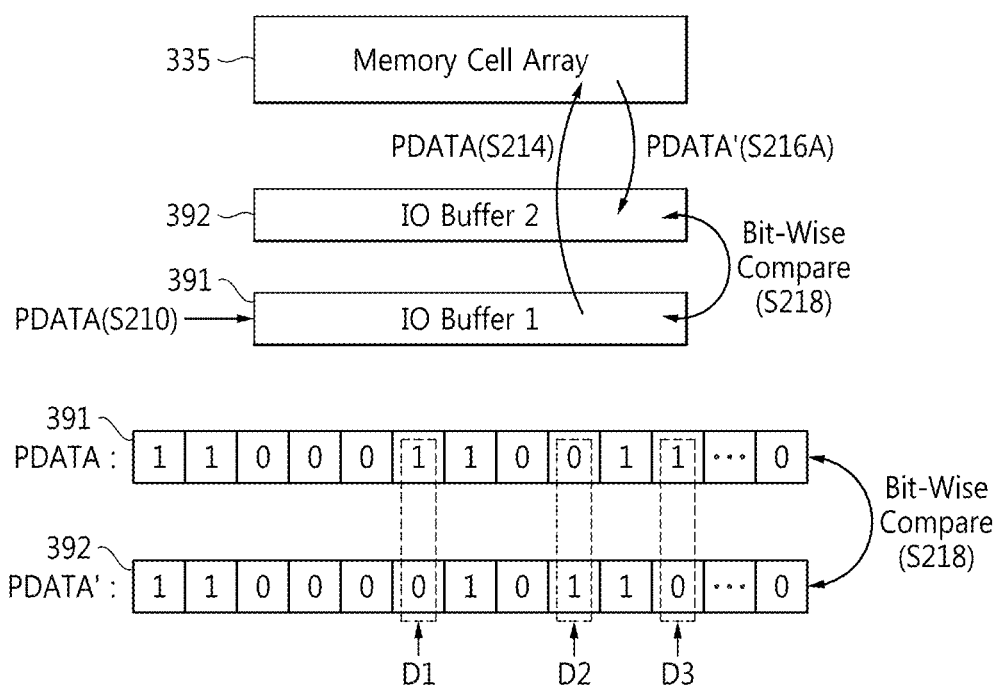
FIG. 11 is a conceptual diagram illustrating the operation of the memory device illustrated in FIG. 6 according to an exemplary embodiment of the inventive concept.
Figure 12:
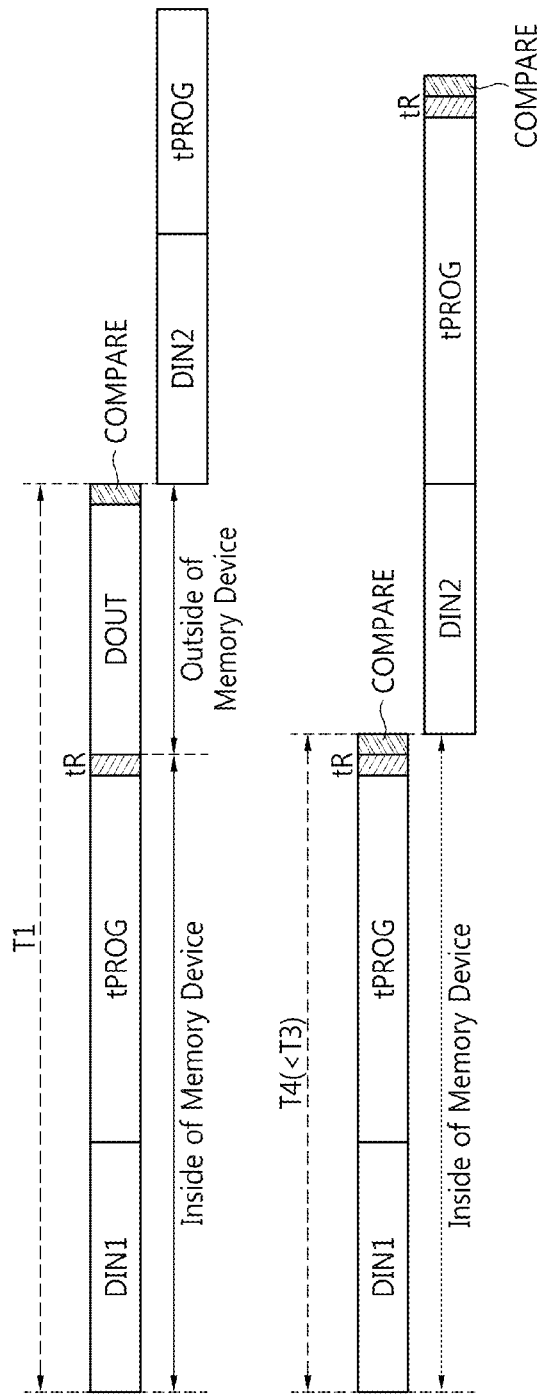
FIG. 12A is a timing chart showing a comparative example of a read-verify operation.
FIG. 12B is a timing chart showing an internal read-verify operation performed in the memory device illustrated in FIG. 6 according to an exemplary embodiment of the inventive concept.

FIG. 10 is a flowchart of the operation of the memory device 300B illustrated in FIG. 6 according to an exemplary embodiment of the inventive concept. FIG. 11 is a conceptual diagram illustrating the operation of the memory device 300B illustrated in FIG. 6 according to an exemplary embodiment of the inventive concept. FIGS. 12A and 12B are timing charts respectively showing a read-verify operation according to a comparative example and an internal read-verify operation performed in the memory device 300B illustrated in FIG. 6 according to an exemplary embodiment of the inventive concept.

Referring to FIG. 6 and FIGS. 10 through 12B, the data PDATA, which is output from the controller 210A or 210B and will be written to the memory cell array 335, may be stored in the first I/O buffer 391 in operation S210. The data PDATA is internal read-verify target data.

The page buffer 340 illustrated in FIG. 6 may write the data PDATA output from the first I/O buffer 391 to the memory cell array 335 in operation S214. The data PDATA may be transmitted to the page buffer 340 through the Y-decoder 350.

For the internal read-verify operation, the page buffer 340 may read the data PDATA' from the memory cell array 335 and may transmit the data PDATA' that has been read to the second I/O buffer 392 through the Y-decoder 350 in operation S216A. Accordingly, the data PDATA' that has been read may be stored in the second I/O buffer 392.

The data PDATA' that has been read from the memory cell array 335 may be related to the data PDATA that has been written to the memory cell array 335. The data PDATA may be changed during a write operation or a read operation. The changed data is the data PDATA' that has been read.

The data comparator 395 may receive the data PDATA' (e.g., second data from the second I/O buffer 392) and the data PDATA (e.g., first data from the first I/O buffer 391), may perform a bitwise comparison on the first data and the second data, and may transmit the difference value DV corresponding to the number of bitwise differences to the difference value register 380 in operation S218. As shown in FIG. 11, it is determined that three values D1, D2, and D3 are different between the first data PDATA and the second data PDATA' as a result of the bitwise comparison.

The comparator 385 may receive the reference value REF from the reference value register 375 and the difference value DV from the difference value register 380, and may compare the values REF and DV with each other in operation S220. When it is determined that the difference value DV is less than the reference value REF in operation S220 (e.g., upon determining that the difference value DV is less than the reference value REF), the comparator 385 may generate the status signal STATUS having a first state indicating that the data PDATA (e.g., metadata or randomized metadata) has been successfully written to the memory cell array 335, and may transmit the status signal STATUS to the first I/O buffer 391 in operation S222.

The first I/O buffer 391 may transmit the status signal STATUS having the first state to the controller 210A or 210B through at least one of the I/O pads I/O0 through I/O7. Accordingly, the controller 210A or 210B may recognize that the data PDATA (e.g., metadata or randomized metadata) has been successfully written to the memory cell array 335 based on the status signal STATUS having the first state.

When it is determined that the difference value DV is equal to or greater than the reference value REF in operation S220 (e.g., in response to determining that the difference value DV is equal to or greater than the reference value REF), the comparator 385 may generate the status signal STATUS having a second state indicating that the data PDATA (e.g., metadata or randomized metadata) has not been successfully written to the memory cell array 335, and may transmit the status signal STATUS to the first I/O buffer 391 in operation S224.

The first I/O buffer 391 may transmit the status signal STATUS having the second state to the controller 210A or 210B through at least one of the I/O pads I/O0 through I/O7. Accordingly, the controller 210A or 210B may recognize that the data PDATA (e.g., metadata or randomized metadata) has not been successfully written to the memory cell array 335 based on the status signal STATUS having the second state.

The memory device 300B may read data from selected non-volatile memory cells in the memory cell array 335 and transmit the data that has been read to the controller 210A or 210B according to the control of the controller 210A or 210B, and the controller 210A or 210B may perform a read-verify operation on the data received from the memory device 300B in operation S226. The read-verify operation may be directly performed by the CPU 230. At this time, the CPU 230 may perform data comparison and management.

FIG. 12A shows a timing chart illustrating a comparative example of a read-verify operation performed by a controller, and FIG. 12B shows a timing chart illustrating an internal read-verify operation performed in the memory device 300B illustrated in FIG. 6 according to an exemplary embodiment of the inventive concept. In the comparative example of the read-verify operation illustrated in FIG. 12A, a memory device transmits read-verify target data to the controller and the controller performs the read-verify operation on the data. According to the exemplary embodiment of the inventive concept illustrated in FIG. 12B, the memory device 300B itself performs an internal read-verify operation on the read-verify target data. Accordingly, unless the status signal STATUS having the second state is generated, the memory device 300B does not transmit the read-verify target data to the controller 210A or 210B. Therefore, the data storage device 200A or 200B does not require the time DOUT and the time COPY to function. As a result, the performance of a data storage device according to exemplary embodiments of the inventive concept (e.g., the data storage device 200A or 200B) may be improved.

Referring to FIGS. 12A and 12B, since the data storage device 200A or 200B does not require the time DOUT and the time COPY to function, the time T4 taken to perform an internal read-verify operation according to exemplary embodiments of the inventive concept may be significantly shorter than the time T1 taken to perform the read-verify operation according to the comparative example of FIG. 12A. Referring to FIGS. 9B and 12B, the time COPY is not required for functionality in the exemplary embodiment illustrated in FIG. 12B, and thus, the time T4 is shorter than the time T3.

Figure 13:
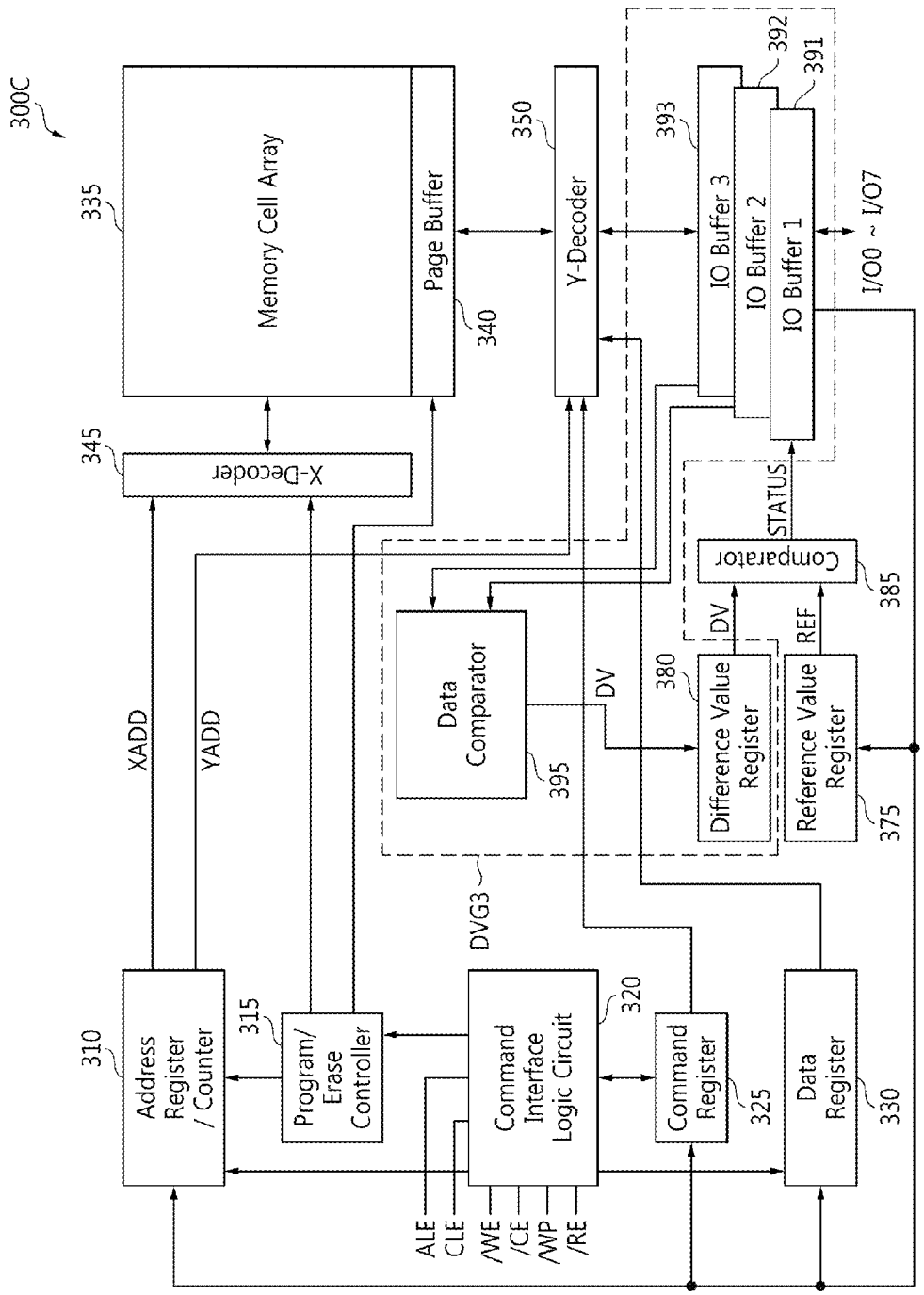
FIG. 13 is a block diagram of an example of the memory device illustrated in FIGS. 1A and 1B according to an exemplary embodiment of the inventive concept.

FIG. 13 is a block diagram of an example 300C of the memory device 300 illustrated in FIGS. 1A and 1B according to an exemplary embodiment of the inventive concept. Referring to FIG. 13, the memory device 300C may include the address register/counter 310, the program/erase controller 315, the command interface logic circuit 320, the command register 325, the data register 330, the memory cell array 335, the page buffer 340, the X-decoder 345, the Y-decoder 350, the reference value register 375, the difference value register 380, the comparator 385, three I/O buffers 391, 392, and 393, a data comparator 395, and the I/O pads I/O0 through I/O7.

Figure 14:
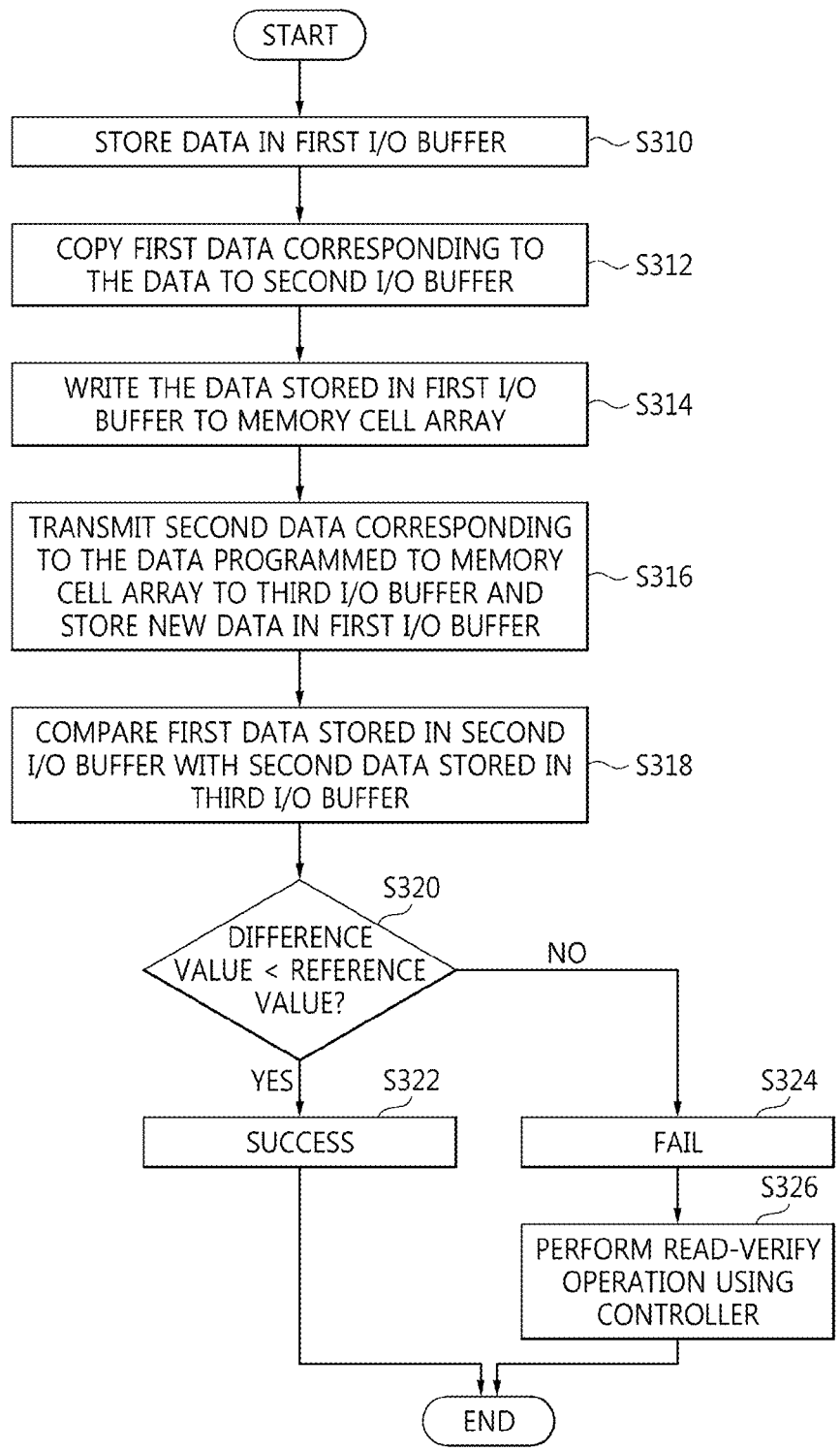
FIG. 14 is a flowchart of the operation of the memory device illustrated in FIG. 13 according to an exemplary embodiment of the inventive concept.
Figure 15:
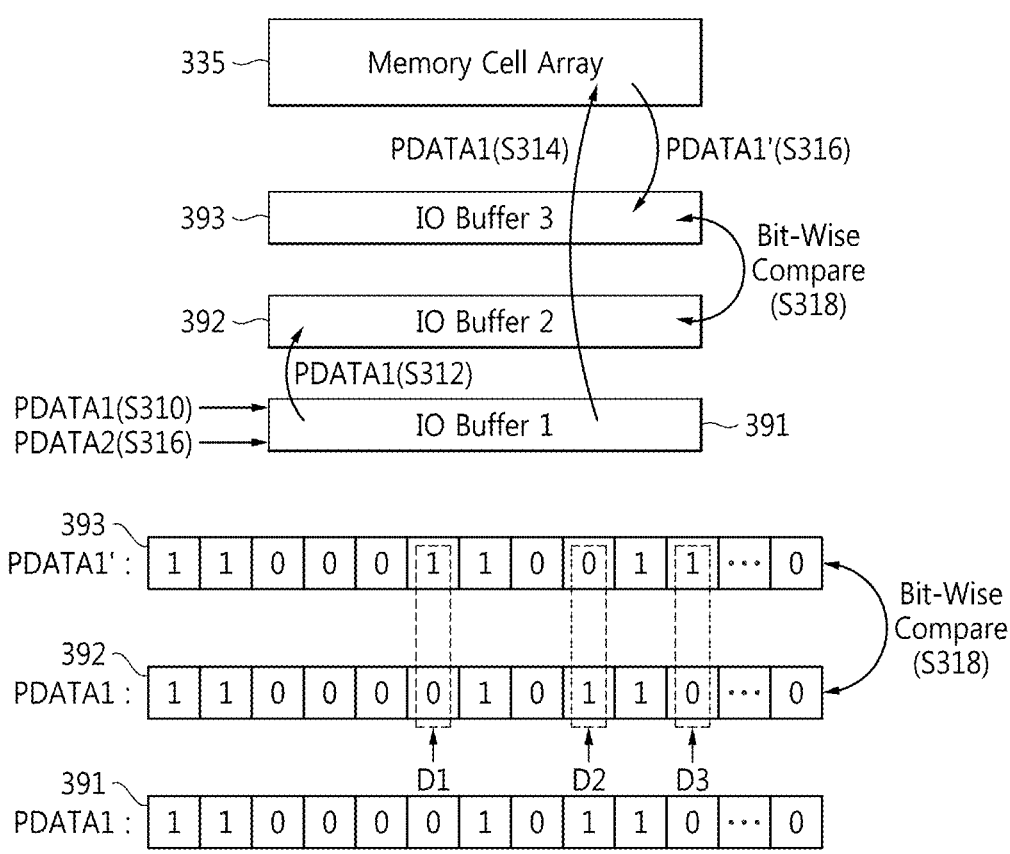
FIG. 15 is a conceptual diagram illustrating the operation of the memory device illustrated in FIG. 13 according to an exemplary embodiment of the inventive concept.
Figures 16A, 16B:
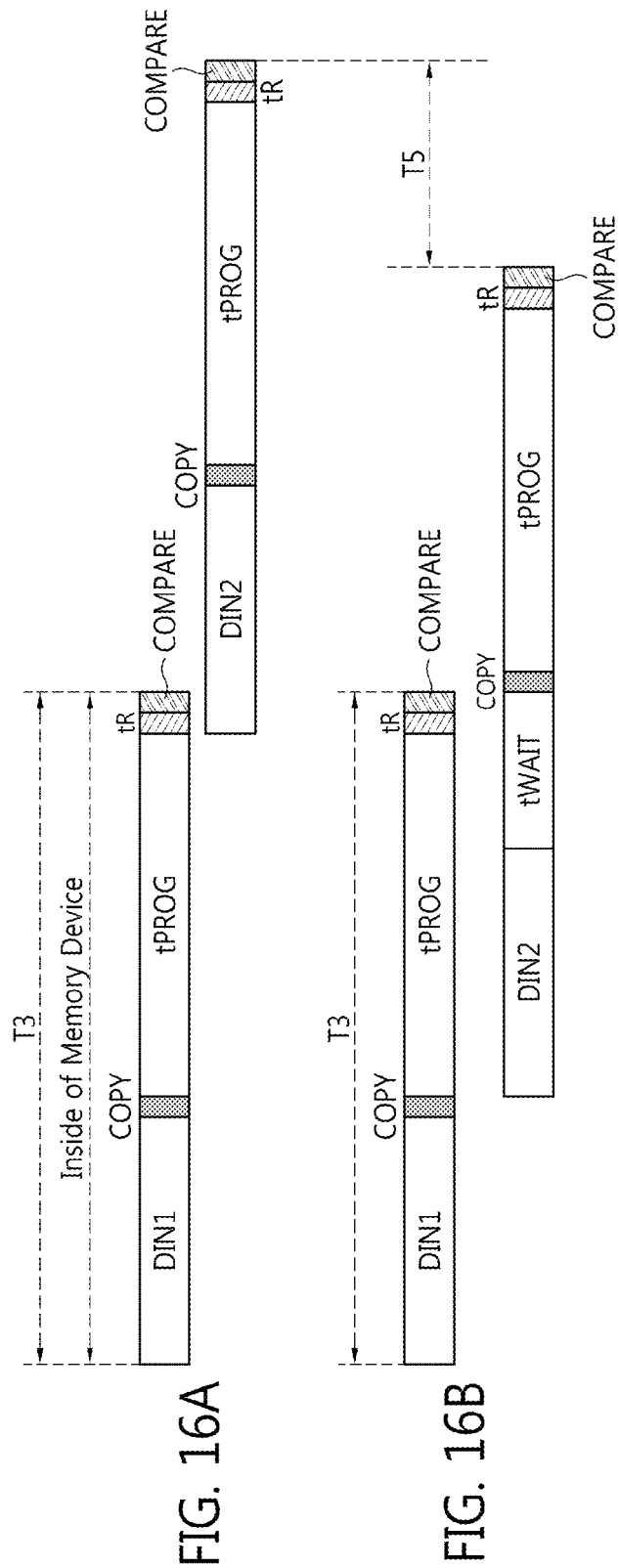
FIGS. 16A and 16B are timing charts showing an internal read-verify operation performed in the memory device illustrated in FIG. 13 according to exemplary embodiments of the inventive concept.

FIG. 14 is a flowchart of the operation of the memory device 300C illustrated in FIG. 13 according to an exemplary embodiment of the inventive concept. FIG. 15 is a conceptual diagram illustrating the operation of the memory device 300C illustrated in FIG. 13 according to an exemplary embodiment of the inventive concept. FIGS. 16A and 16B are timing charts showing an internal read-verify operation performed in the memory device 300C illustrated in FIG. 13 according to exemplary embodiments of the inventive concept. The operation of the memory device 300C comparing first data with second data using three I/O buffers 391, 392, and 393 will be described with reference to FIGS. 13 through 16B.

Data PDATA1, which is output from the controller 210A or 210B and will be written to the memory cell array 335, may be stored in the first I/O buffer 391 in operation S310. The data PDATA1 may be internal read-verify target data.

The data PDATA1 stored in the first I/O buffer 391 may be copied to the second I/O buffer 392 in operation S312.

The data PDATA1 copied to the second I/O buffer 392 may be the first data. In an exemplary embodiment, the data PDATA1 stored in the first I/O buffer 391 is the same as the data PDATA1 copied to the second I/O buffer 392.

The page buffer 340 may write the data PDATA1 output from the first I/O buffer 391 to the memory cell array 335 in operation S314. The data PDATA1 may be transmitted to the page buffer 340 through the Y-decoder 350.

For the internal read-verify operation, the page buffer 340 may read data PDATA1' from the memory cell array 335 and may transmit the data PDATA1' that has been read to the third I/O buffer 393 in operation S316. At a time that is simultaneous/in parallel with the transmission of the data PDATA1' to the third I/O buffer 393, new data PDATA2 may be stored in the first I/O buffer 391 in operation S316. The data processing speed of the memory device 300C may be increased due to operation S316.

The data PDATA1' that has been read from the memory cell array 335 may be related to the data PDATA1 that has been written to the memory cell array 335. For example, the data PDATA1 may be changed during a program operation or a read operation and the changed data is the data PDATA1' that has been read.

The data comparator 395 may receive the data PDATA1 (e.g., the first data from the second I/O buffer 392) and the data PDATA1' (e.g., the second data from the third I/O buffer 393), may perform a bitwise comparison on the first data and the second data, and may transmit the difference value DV corresponding to the number of bitwise differences to the difference value register 380 in operation S318. As shown in FIG. 15, it is determined that three values D1, D2, and D3 are different between the first data PDATA1 and the second data PDATA1' as a result of the bitwise comparison.

The comparator 385 may receive the reference value REF from the reference value register 375 and the difference value DV from the difference value register 380, and may compare the values REF and DV with each other in operation S320. When the difference value DV is less than the reference value REF in operation S320, the comparator 385 may generate the status signal STATUS having a first state indicating that the data PDATA1 (e.g., metadata or randomized metadata) has been successfully written to the memory cell array 335, and may transmit the status signal STATUS to the first I/O buffer 391 in operation S322.

The first I/O buffer 391 may transmit the status signal STATUS having the first state to the controller 210A or 210B through at least one of the I/O pads I/O0 through I/O7. Accordingly, the controller 210A or 210B may recognize that the data PDATA1 (e.g., metadata or randomized metadata) has been successfully written to the memory cell array 335 based on the status signal STATUS having the first state.

When the difference value DV is equal to or greater than the reference value REF in operation S320, the comparator 385 may generate the status signal STATUS having a second state indicating that the data PDATA1 (e.g., metadata or randomized metadata) has not been successfully written to the memory cell array 335, and may transmit the status signal STATUS to the first I/O buffer 391 in operation S324.

The first I/O buffer 391 may transmit the status signal STATUS having the second state to the controller 210A or 210B through at least one of the I/O pads I/O0 through I/O7. Accordingly, the controller 210A or 210B may recognize that the data PDATA1 (e.g., metadata or randomized metadata) has not been successfully written to the memory cell array 335 based on the status signal STATUS having the second state.

The memory device 300C may read data from selected non-volatile memory cells in the memory cell array 335 and transmit the data that has been read to the controller 210A or 210B according to the control of the controller 210A or 210B and the controller 210A, or 210B may perform a read-verify operation on the data received from the memory device 300C in operation S326. The read-verify operation may be directly performed by the CPU 230. At this time, the CPU 230 may perform data comparison and management.

A difference value generation circuit DVG3 illustrated in FIG. 13 may generate the difference value DV based on the first data (e.g., the data PDATA1 copied to the second I/O buffer 392) related to the data PDATA1 written to the memory cell array 335, and the second data (e.g., the data PDATA1' transmitted from the memory cell array 335 to the third I/O buffer 393) related to the data PDATA1 written to the memory cell array 335. The difference value generation circuit DVG3 may include the difference value register 380, the first I/O buffer 391, the second I/O buffer 392, the third I/O buffer 393, and the data comparator 395.

FIG. 16A shows a timing chart illustrating an internal read-verify operation performed by the memory device 300C illustrated in FIG. 13 according to an exemplary embodiment of the inventive concept. For example, FIG. 16A shows a timing chart illustrating the internal read-verify operation performed according to the conceptual diagram illustrated in FIG. 15 according to an exemplary embodiment of the inventive concept.

Referring to FIGS. 9A, 9B and 16B, in the read-verify operation illustrated in the comparative example of FIG. 9A, a memory device transmits read-verify target data to the controller and the controller performs the read-verify operation on the data. According to exemplary embodiments of the inventive concept, the memory device 300C itself performs an internal read-verify operation on the read-verify target data, as shown in FIGS. 9B and 16A. Accordingly, unless the status signal STATUS having the second state is generated, the memory device 300C does not transmit the read-verify target data to the controller 210A or 210B. Therefore, the data storage device 200A or 200B does not require the time DOUT to function. As a result, the performance of the data storage device 200A or 200B may be enhanced.

Since the data storage device 200A or 200B does not require the time DOUT to function, the time T3 taken to perform an internal read-verify operation according to exemplary embodiments of the inventive concept may be significantly shorter than the time T1 taken to perform the read-verify operation in comparative examples.

Figure 17:
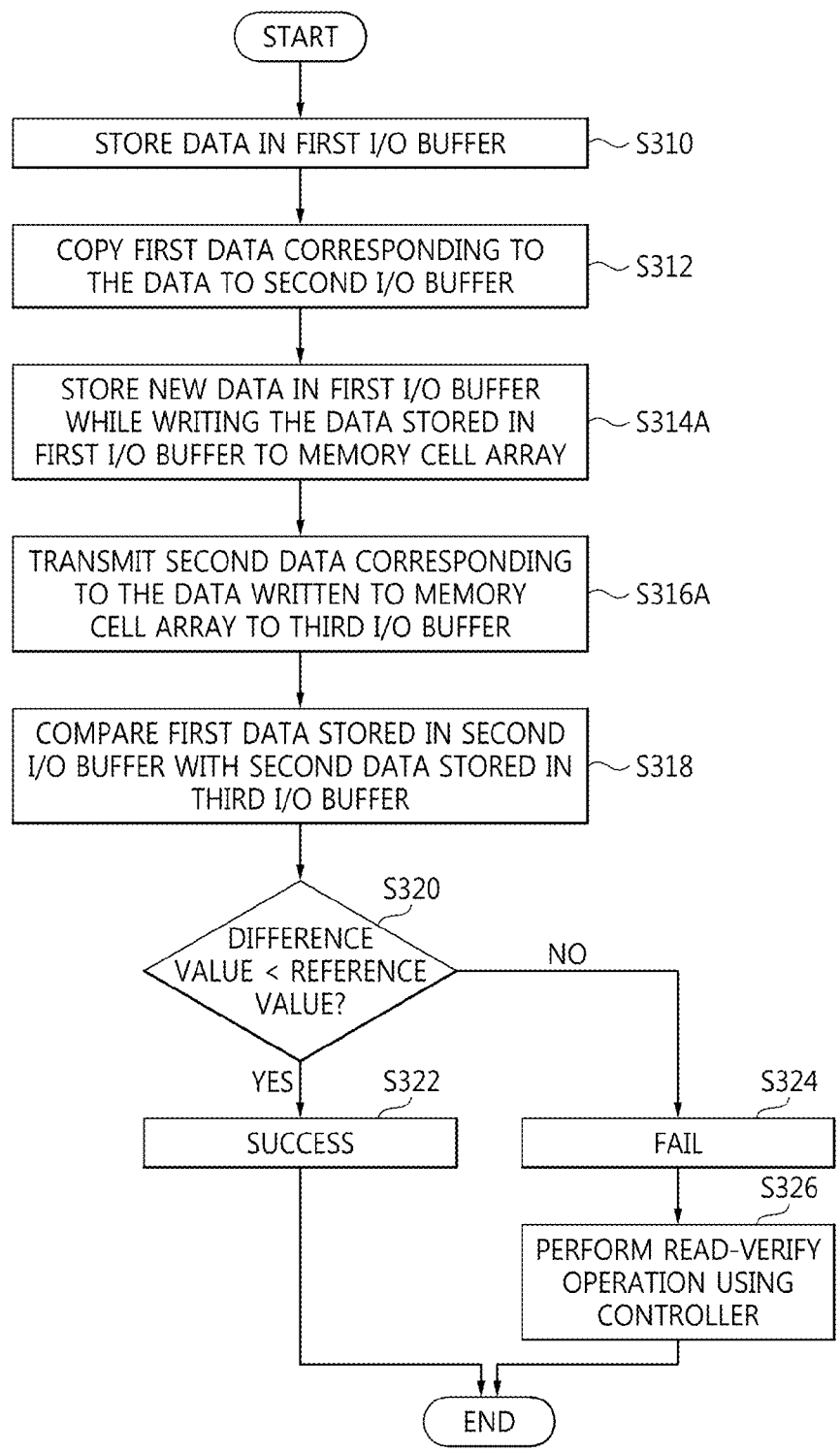
FIG. 17 is a flowchart of the operation of the memory device illustrated in FIG. 13 according to an exemplary embodiment of the inventive concept.
Figure 18:
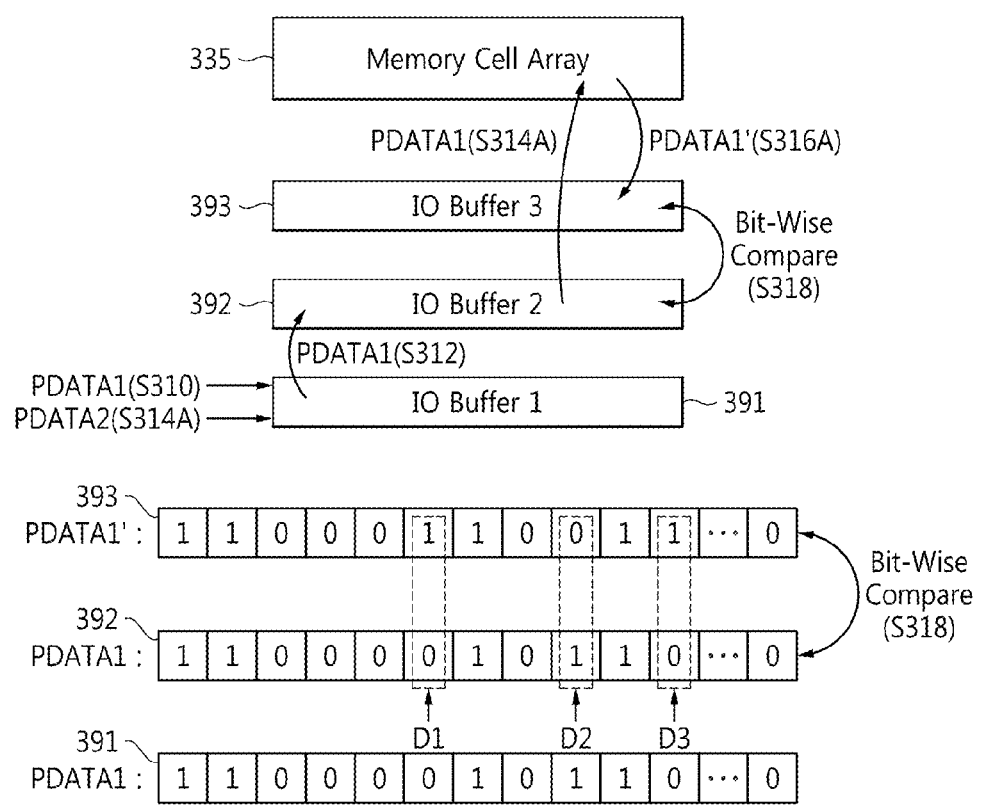
FIG. 18 is a conceptual diagram illustrating the operation of the memory device illustrated in FIG. 13 according to an exemplary embodiment of the inventive concept.

FIG. 17 is a flowchart of the operation of the memory device 300C illustrated in FIG. 13 according to an exemplary embodiment of the inventive concept. FIG. 18 is a conceptual diagram of the operation of the memory device 300C illustrated in FIG. 13 according to an exemplary embodiment of the inventive concept. The operation of the memory device 300C comparing first data with second data using three I/O buffers 391, 392, and 393 according to exemplary embodiments of the inventive concept will be described with reference to FIG. 13 and FIGS. 16A through 18.

The data PDATA1, which is output from the controller 210A or 210B and will be written to the memory cell array 335, may be stored in the first I/O buffer 391 in operation S310. The data PDATA1 may be internal read-verify target data. The data PDATA1 stored in the first I/O buffer 391 may be copied to the second I/O buffer 392 in operation S312.

The page buffer 340 may write the data PDATA1 output from the second I/O buffer 392 to the memory cell array 335 in operation S314A. While the data PDATA1 output from the second I/O buffer 392 is being written to the memory cell array 335, the new data PDATA2 may be stored in the first I/O buffer 391 in operation S314A.

For the internal read-verify operation, the page buffer 340 may read the data PDATA1' from the memory cell array 335 and may transmit the data PDATA1' that has been read to the third I/O buffer 393 in operation S316A. The data processing speed of the memory device 300C may be increased due to operation S316A.

The data comparator 395 may receive the data PDATA1 (e.g., the first data from the second I/O buffer 392) and the data PDATA1' (e.g., the second data from the third I/O buffer 393), may perform a bitwise comparison on the first data and the second data, and may transmit the difference value DV corresponding to the number of bitwise differences to the difference value register 380 in operation S318.

FIG. 16B shows a timing chart illustrating an internal read-verify operation performed by the memory device 300C illustrated in FIG. 13 according to an exemplary embodiment of the inventive concept. For example, FIG. 16B shows a timing chart illustrating the internal read-verify operation performed according to the conceptual diagram illustrated in FIG. 18.

Figure 19:
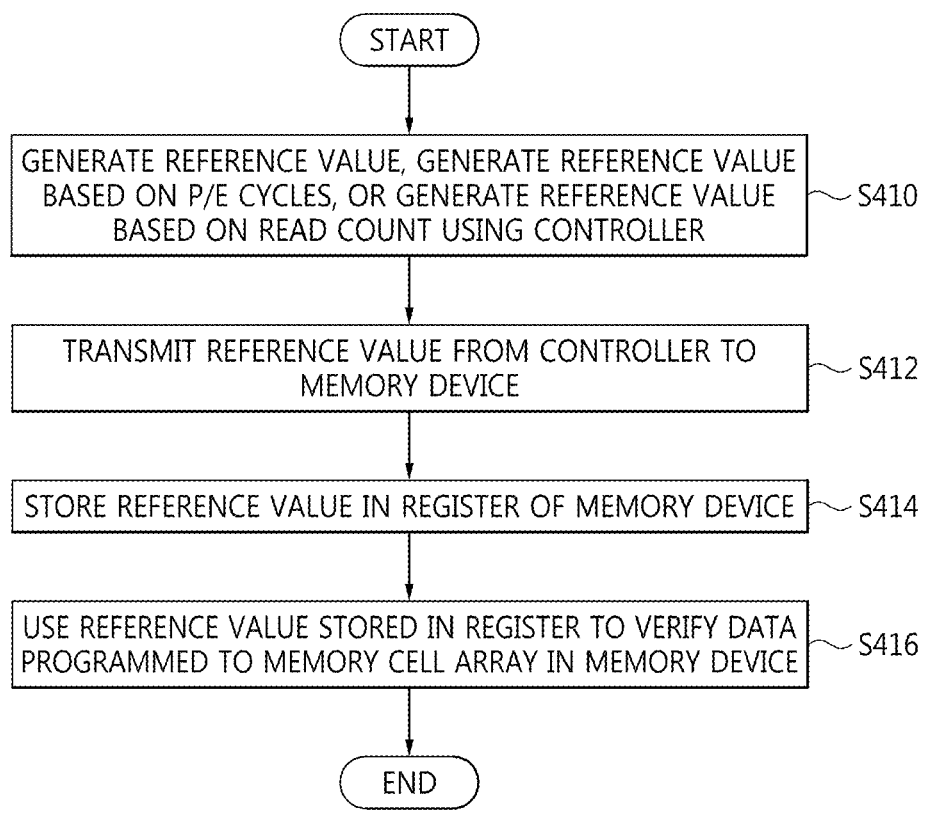
FIG. 19 is a flowchart of a method of setting a reference value according to exemplary embodiments of the inventive concept.

FIG. 19 is a flowchart of a method of setting a reference value according to exemplary embodiments of the inventive concept. Referring to FIGS. 1A, 1B, 2, 6, 13, and 19, the controller 210A or 210B may generate the reference value in operation S410. As an alternative, the controller 210A or 210B may generate the reference value based on P/E cycles with respect to non-volatile memory cells included in a block included in the memory cell array 335, in which data will be stored, in operation S410. As another alternative, the controller 210A or 210B may generate the reference value based on a read count (e.g., the number of times data has been read) with respect to non-volatile memory cells included in a page included in the memory cell array 335, in which data will be stored, in operation S410. As described above, the controller 210A or 210B may manage the reference value.

The memory controller 260 or 262 may transmit the reference value, which has been generated using one of the above-described methods, to at least one memory device 300 included in the way WAY1 or WAY2 through the channel CH1 or CH2 in operation S412. The memory device 300 may store the reference value received from the memory controller 260 or 262 in the reference value register 375 included in the memory device 300 in operation S414.

As described above with reference to FIGS. 2 through 18, the memory device 300A, 300B, or 300C may perform an internal read-verify operation on the data written to the memory cell array 335 using the reference value REF stored in the reference value register 375 and the difference value DV, and may transmit only the status signal STATUS to the memory controller 260 or 262 in operation S416. For the read-verify operation of the data, the memory device 300A, 300B, or 300C does not always transmit the data to the memory controller 260 or 262 by default. For example, according to exemplary embodiments, the memory device 300A, 300B, or 300C transmits the data to be subjected to a read-verify operation to the memory controller 260 or 262 according to the control of the memory controller 260 or 262 only when the memory device 300A, 300B, or 300C fails in its internal read-verify operation of the data. Therefore, according to exemplary embodiments, the controller 210A or 210B performs a read-verify operation of the data only when the memory device 300A, 300B, or 300C fails in the internal read-verify operation of the data.

Figure 20:
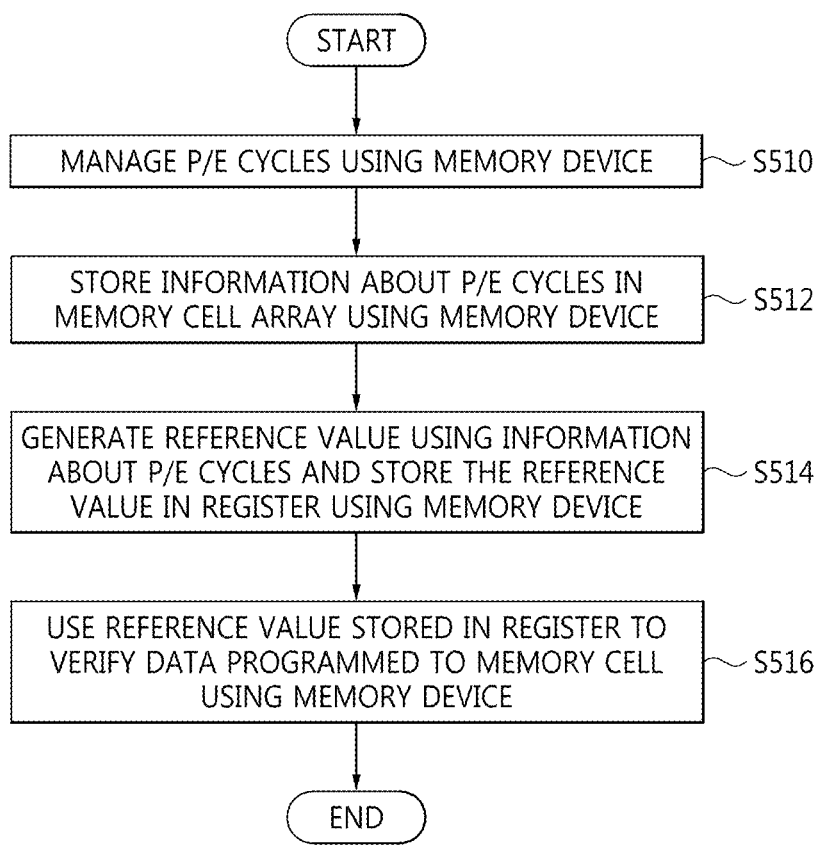
FIG. 20 is a flowchart of a method of setting a reference value using program/erase cycles according to exemplary embodiments of the inventive concept.

FIG. 20 is a flowchart of a method of setting a reference value using P/E cycles according to exemplary embodiments of the inventive concept. A method of managing the reference value using the memory device 300, and more particularly, the command interface logic circuit 320, will be described with reference to FIGS. 2, 6, 13, and 20.

The memory device 300 may manage P/E cycles. For example, the command interface logic circuit 320 may calculate a P/E cycle for each block included in the memory cell array 335 based on at least one control signal from among the control signals ALE, CLE, /WE, /CE, /WP, and /RE in operation S510.

Information about the P/E cycle calculated by the command interface logic circuit 320 may be transmitted to the Y-decoder 350 through the command register 325, and the information output from the Y-decoder 350 may be written to the memory cell array 335 by the page buffer 340 in operation S512. The reference value programmed to the memory cell array 335 may be detected and amplified by the page buffer 340 and then stored in the reference value register 375 through the Y-decoder 350 and the I/O buffer 390 or 391 in operation S514.

As described above with reference to FIGS. 2 through 18, the memory device 300A, 300B, or 300C may itself perform a read-verify operation of data programmed to the memory cell array 335 using the reference value REF stored in the reference value register 375 and the difference value DV, and then transmit only the status signal STATUS to the memory controller 260 or 262 in operation S516.

For a read-verify operation of data, the memory device 300A, 300B, or 300C does not always transmit by default the data to the memory controller 260 or 262. For example, according to exemplary embodiments, the memory device 300A, 300B, or 300C transmits the data to the memory controller 260 or 262 according to the control of the memory controller 260 or 262 only when a read-verify operation of data performed by the memory device 300A, 300B, or 300C itself fails. Thus, according to exemplary embodiments of the inventive concept, the controller 210A or 210B performs a read-verify operation of the data only when the read-verify operation of the data performed by the memory device 300A, 300B, or 300C fails.

Figure 21:
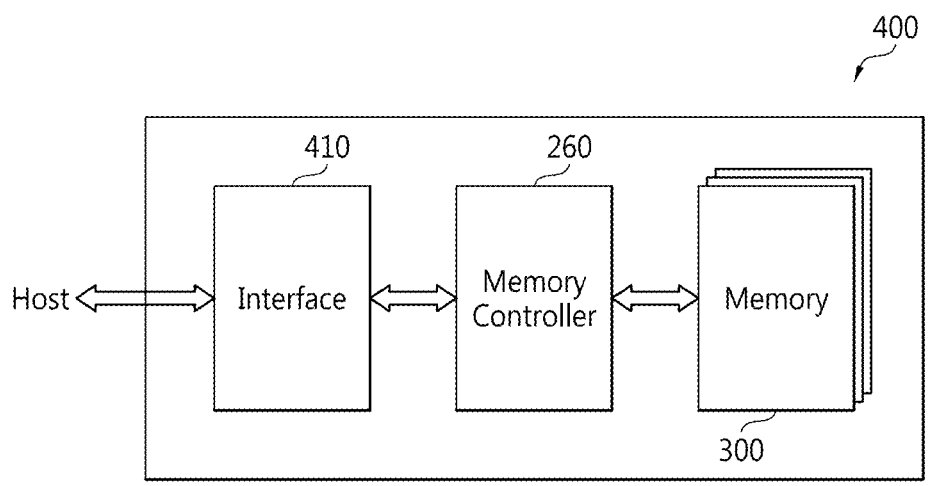
FIG. 21 is a block diagram of a data processing system according to exemplary embodiments of the inventive concept.

FIG. 21 is a block diagram of a data processing system 400 according to exemplary embodiments of the inventive concept. The data processing system 400 may include the memory controller 260, an interface 410, and the memory device 300. Referring to FIGS. 1A and 1B, the memory controller 260 or 262 and the memory device 300 may be separate components. However, exemplary embodiments of the inventive concept are not limited thereto. For example, in the exemplary embodiment illustrated in FIG. 21, the memory controller 260 and the memory device 300 may be mounted on a single system board or may be packaged into a single package. The memory controller 260 and the memory device 300 may share a single semiconductor substrate with each other.

The interface 410 may control transmission of a command and/or data between a host (e.g., the host 130 in FIG. 1A or 1B) and the memory controller 260. The memory controller 260 may control a program operation, a read operation, or an erase operation on the memory device 300 according to a command received from the host. The memory controller 260 may transmit an indicator signal, which indicates that data to be written to the memory cell array 335 of the memory device 300 is metadata, to the memory device 300. The memory device 300 may write the metadata to the memory cell array 335 using SLC programming in response to the indicator signal. The memory device 300 may also perform a read-verify operation of the metadata, as described with reference to FIGS. 2 through 18, in response to the indicator signal.

Figure 22:
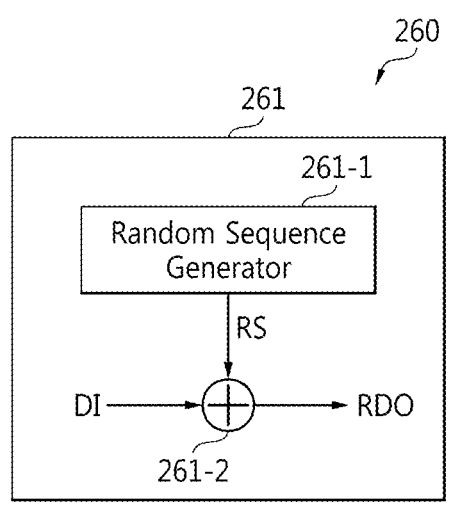
FIG. 22 is a block diagram of the memory controller illustrated in FIGS. 1A, 1B, and 21, which generates randomized data, according to an exemplary embodiment of the inventive concept.

FIG. 22 is a block diagram of the memory controller 260 illustrated in FIGS. 1A, 1B, and 21, which generates randomized data, according to an exemplary embodiment of the inventive concept. Referring to FIGS. 1A, 1B, 21, and 22, the memory controller 260 or 262 may include a randomizer 261. The randomizer 261 may include a random sequence generator 261-1 and a logic gate 261-2.

The random sequence generator 261-1 may generate a random sequence RS using a seed. The logic gate 261-2 may perform an operation on the random sequence RS and input data DI to generate randomized data RDO. The logic gate 261-2 may be, for example, an exclusive OR gate. However, the logic gate 261-2 is not limited thereto. The randomizer 261 may randomly change the input data DI so that the amount of 1s and 0s in the input data DI is stochastically constant.

An increase in the degree of integration in memory may lead to an increase in interference between memory cells included in the memory cell array 335. That is, interference may increase or decrease depending on status (e.g., a data value) of each of adjacent memory cells. The data value may be 1 or 0. When random data (e.g., randomized data) is stored across adjacent memory cells, interference between data values (e.g., data patterns) respectively stored in the adjacent memory cells can be minimized. Program voltage disturbance, pass voltage disturbance, coupling between floating poly gates, and/or back pattern dependency may exist among flash memory cells.

Since the randomizer 261 randomizes the input data DI using the random sequence RS, interference between flash memory cells is minimized. As a result, the reliability of the memory device 300 may be increased. The randomized data RDO may be transmitted from the randomizer 261 to the memory device 300 in the way WAY1 or WAY2 through the channel CH1 or CH2. Alternatively, random data (e.g., randomized data) may be generated within the memory device 300.

Figure 23:
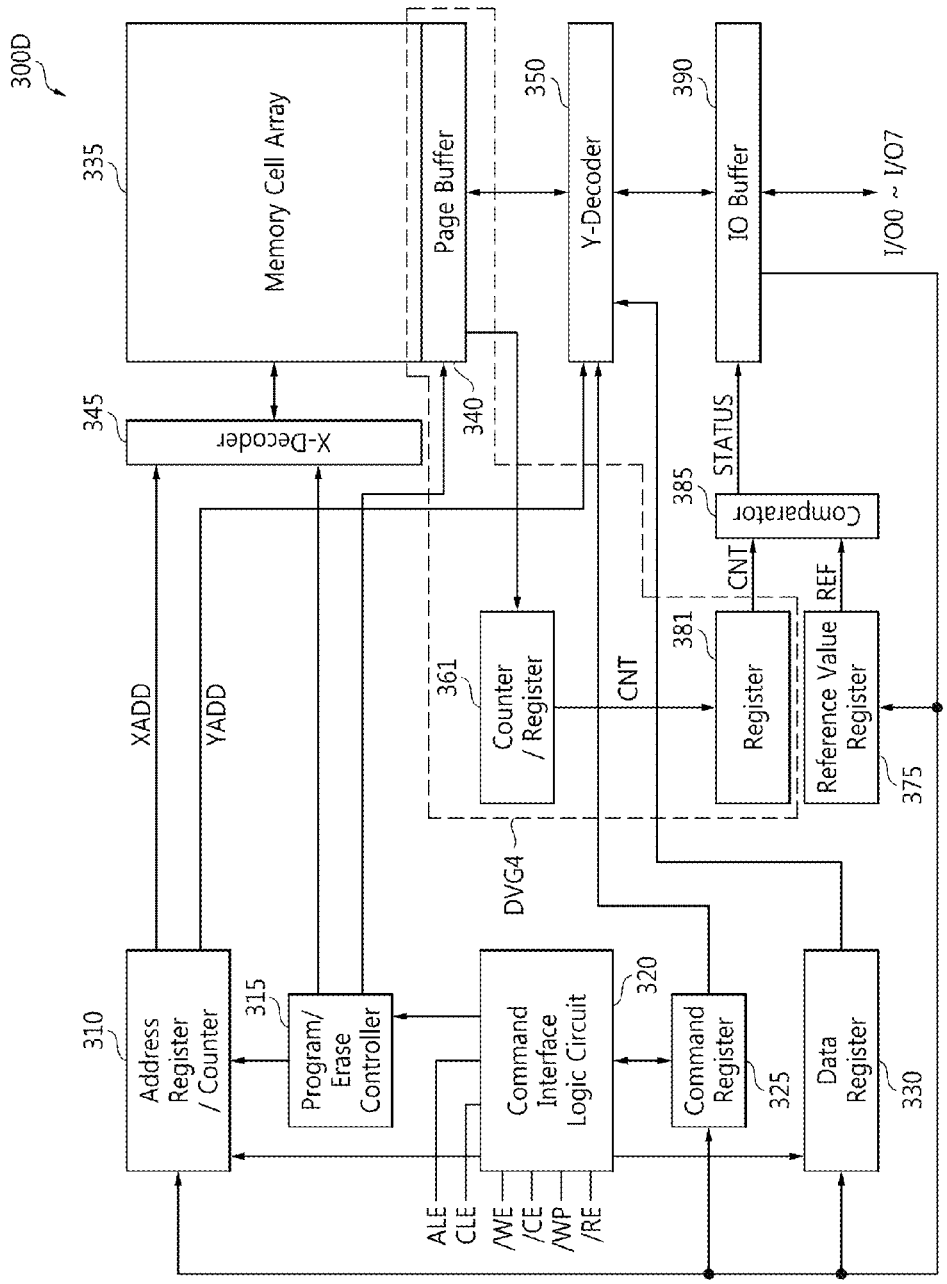
FIG. 23 is a block diagram of an example of the memory device illustrated in FIGS. 1A and 1B according to an exemplary embodiment of the inventive concept.

FIG. 23 is a block diagram of an example 300D of the memory device 300 illustrated in FIGS. 1A and 1B according to an exemplary embodiment of the inventive concept. Referring to FIGS. 1A, 1B, and 23, the memory device 300D may include the address register/counter 310, the program/erase controller 315, the command interface logic circuit 320, the command register 325, the data register 330, the memory cell array 335, the page buffer 340, the X-decoder 345, the Y-decoder 350, a counter/register 361, the reference value register 375, a register 381, the comparator 385, the I/O buffer 390, and the I/O pads I/O0 through I/O7.

The controller 210A or 210B may determine, as a reference value, the number of on-cells (or off-cells) corresponding to values of data to be written to the memory cell array 335, and may write/set the reference value in the reference value register 375. The page buffer 340 in the memory device 300D may write the data to selected non-volatile memory cells in the memory cell array 335. To perform an internal read-verify operation in the memory device 300D, the page buffer 340 may read the data from the selected non-volatile memory cells.

During the internal read-verify operation, the counter/register 361 may count the number of on-cells (or off-cells) among the selected non-volatile memory cells based on data (e.g., metadata or randomized data) that has been read from the selected non-volatile memory cells, may generate and latch a count value CNT corresponding to the count result, and may store the latched count value CNT in the register 381. The reference value register 375 may receive the reference value corresponding to the number of on-cells from the I/O buffer 390 and store the reference value therein. The comparator 385 may compare the reference value REF output from the reference value register 375 with the count value CNT output from the register 381.

When the reference value REF is the same as the count value CNT or when a difference between the reference value REF and the count value CNT is within a predetermined range, the comparator 385 may generate the status signal STATUS having the first state indicating that the data (e.g., metadata or randomized data) has been successfully written to the selected non-volatile memory cells, and may transmit the status signal STATUS to the I/O buffer 390. The I/O buffer 390 may transmit the status signal STATUS having the first state to the controller 210A or 210B through at least one of the I/O pads I/O0 through I/O7. The controller 210A or 210B may recognize that the data (e.g., metadata or randomized data) has been successfully programmed to the selected non-volatile memory cells based on the status signal STATUS having the first state.

When the reference value REF is different from the count value CNT or when the difference between the reference value REF and the count value CNT is out of the predetermined range, the comparator 385 may generate the status signal STATUS having the second state indicating that the data (e.g., metadata or randomized data) has not been successfully written to the selected non-volatile memory cells, and may transmit the status signal STATUS to the I/O buffer 390. The I/O buffer 390 may transmit the status signal STATUS having the second state to the controller 210A or 210B through at least one of the I/O pads I/O0 through I/O7. The controller 210A or 210B may recognize that the data (e.g., metadata or randomized data) has not been successfully programmed to the selected non-volatile memory cells based on the status signal STATUS having the second state. At this time, the controller 210A or 210B may read the data (e.g., a target of the internal read-verify operation from the memory device 300D) and perform a read-verify operation on the data that has been read.

Although a method of generating a difference value based on a difference between first data related to data programmed to non-volatile memory cells in the memory cell array 335 and second data related to the data programmed to the non-volatile memory cells using two I/O buffers has been described with reference to the exemplary embodiments described above, exemplary embodiments of the inventive concept are not limited thereto. For example, in exemplary embodiments, the difference value may be generated using two page buffers or using a storage device storing the first data and a storage device storing the second data.

As described above, according to exemplary embodiments of the inventive concept, a memory device itself performs an internal read-verify operation on data targeted to be verified, and the memory device does not transmit the read-verify target data to a controller when the read-verify target data has been successfully written. As a result, the performance of a memory system including the memory device may be improved. Further, according to exemplary embodiments, the memory device performing the internal read-verify operation may prevent data from becoming corrupt without a loss of performance of the memory system as compared to a comparative example in which a read-verify operation is skipped.

While the present inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. A method of operating a memory device, comprising:
    writing initial data to non-volatile memory cells of a non-volatile memory cell array;
    generating a difference value based on a difference between first data related to the initial data written to the non-volatile memory cells and second data related to the initial data written to the non-volatile memory cells;
    comparing the difference value with a reference value;
    generating a status signal having a first state indicating that the initial data has been successfully written when the difference value is less than the reference value, and having a second state indicating that the initial data has not been successfully written when the difference value is equal to or greater than the reference value;
    performing a read-verify operation on the initial data, by the memory device, when the status signal has the first state;
    transmitting the status signal to a controller; and
    transmitting the initial data to the controller when the status signal has the second state,
    wherein the status signal causes the controller to perform the read-verify operation on the initial data when the status signal has the second state.

2. The method of claim 1, wherein the initial data is randomized by one of the controller and the memory device.

3. The method of claim 1, wherein generating the difference value comprises:
    reading the initial data from the non-volatile memory cells;
    generating the first data and the second data based on the initial data that has been read, wherein the first data corresponds to a number of on-cells from among the non-volatile memory cells and the second data corresponds to a number of off-cells from among the non-volatile memory cells; and
    calculating the difference value using the first data and the second data.

4. The method of claim 1, wherein writing the initial data comprises:
    writing the initial data to the non-volatile memory cells using a first buffer,
    wherein the first data is obtained by copying the initial data stored in the first buffer to a second buffer, the second data is obtained by reading the initial data from the non-volatile memory cells and subsequently storing the initial data in the first buffer, and the difference value is a number of bitwise differences between values of the first data stored in the second buffer and corresponding values of the second data stored in the first buffer.

5. The method of claim 1, wherein writing the initial data comprises:
    writing the initial data to the non-volatile memory cells using a first buffer,
    wherein the first data is obtained by storing the initial data in the first buffer, the second data is obtained by reading the initial data from the non-volatile memory cells and subsequently storing the initial data in a second buffer, and the difference value is a number of bitwise differences between values of the first data stored in the first buffer and corresponding values of the second data stored in the second buffer.

6. The method of claim 1, wherein writing the initial data comprises:
    writing the initial data to the non-volatile memory cells using a first buffer,
    wherein the first data is obtained by copying the initial data stored in the first buffer to a second buffer, the second data is obtained by reading the initial data from the non-volatile memory cells and subsequently storing the initial data in a third buffer, and the difference value is a number of bitwise differences between values of the first data stored in the second buffer and corresponding values of the second data stored in the third buffer.

7. The method of claim 1, wherein writing the initial data comprises:
    writing the initial data to the non-volatile memory cells using a second buffer,
    wherein the first data is obtained by copying the initial data from a first buffer to the second buffer, the second data is obtained by reading the initial data from the non-volatile memory cells and subsequently storing the initial data in a third buffer, and the difference value is a number of bitwise differences between values of the first data stored in the second buffer and corresponding values of the second data stored in the third buffer.

8. The method of claim 1, wherein the reference value is written to the memory device by the controller.

9. The method of claim 1, wherein the reference value is determined based on at least one of program/erase cycles and a read count with respect to the non-volatile memory cells.

10. The method of claim 1, wherein the initial data is metadata related to an operation of the memory device, and the metadata is stored in the non-volatile memory cells using single-level cell programming when each of the non-volatile memory cells is a multi-level cell storing information of at least two bits.

11. The method of claim 1, wherein the non-volatile memory cell array is a three-dimensional memory cell array and each of the non-volatile memory cells comprises a charge trap layer.

12. A memory device, comprising:
    a non-volatile memory cell array comprising non-volatile memory cells, wherein initial data output from a controller is written to the non-volatile memory cells;
    a difference value generation circuit configured to generate a difference value based on a difference between first data related to the initial data written to the non-volatile memory cells and second data related to the initial data written to the non-volatile memory cells;
    a register configured to store a reference value; and
    a comparator configured to compare the difference value with the reference value stored in the register and to generate a status signal having a first state indicating that the initial data has been successfully written when the difference value is less than the reference value, and having a second state indicating that the initial data has not been successfully written when the difference value is equal to or greater than the reference value, wherein a read-verify operation is performed on the initial data, by the memory device, when the status signal has the first state, wherein the status signal causes the controller to perform the read-verify operation on the initial data when the status signal has the second state.

13. The memory device of claim 12, wherein the difference value generation circuit comprises:
   a page buffer configured to store the initial data read from the non-volatile memory cells;
   an on-cell counter configured to generate the first data based on the initial data stored in the page buffer, wherein the first data corresponds to a number of on-cells from among the non-volatile memory cells;
   an off-cell counter configured to generate the second data based on the initial data stored in the page buffer, wherein the second data corresponds to a number of off-cells from among the non-volatile memory cells; and
   a subtractor configured to calculate the difference value using the first data and the second data.

14. The memory device of claim 12, wherein the difference value generation circuit comprises:
   a first buffer configured to store the first data related to the initial data written to the non-volatile memory cells;
   a second buffer configured to store the first data copied from the first buffer; and
   a data comparator configured to calculate a number of differences between values of the first data output from the second buffer and corresponding values of the second data output from the first buffer, wherein the first buffer stores the second data read from the non-volatile memory cells, and to generate the difference value.

15. The memory device of claim 12, wherein the difference value generation circuit comprises:
   a first buffer configured to store the first data related to the initial data written to the non-volatile memory cells;
   a second buffer configured to store the second data read from the non-volatile memory cells; and
   a data comparator configured to calculate a number of differences between values of the first data stored in the first buffer and corresponding values of the second data stored in the second buffer, and to generate the difference value.

16. The memory device of claim 12, wherein the difference value generation circuit comprises:
   a first buffer configured to store the first data related to the initial data written to the non-volatile memory cells;
   a second buffer configured to store the first data copied from the first buffer;
   a third buffer configured to store the second data read from the non-volatile memory cells; and
   a data comparator configured to calculate a number of differences between values of the first data stored in the second buffer and corresponding values of the second data stored in the third buffer, and to generate the difference value.

17. The memory device of claim 12, wherein the difference value generation circuit comprises:
   a first buffer configured to receive the first data;
   a second buffer configured to store the first data, wherein the first data is copied from the first buffer and is subsequently written to the non-volatile memory cells;
   a third buffer configured to store the second data read from the non-volatile memory cells; and
   a data comparator configured to calculate a number of differences between values of the first data stored in the second buffer and corresponding values of the second data stored in the third buffer, and to generate the difference value.

* * * * *